(12) United States Patent
Ramani et al.

(10) Patent No.: US 7,583,272 B2
(45) Date of Patent: Sep. 1, 2009

(54) METHODS FOR RETRIEVING SHAPES AND DRAWINGS

(75) Inventors: Karthik Ramani, West Lafayette, IN (US); Jiantao Pu, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 294 days.

(21) Appl. No.: 11/288,911

(22) Filed: Nov. 29, 2005

(65) Prior Publication Data

US 2006/0114252 A1 Jun. 1, 2006

Related U.S. Application Data

(60) Provisional application No. 60/631,468, filed on Nov. 29, 2004, provisional application No. 60/664,005, filed on Mar. 21, 2005.

(51) Int. Cl.
*G09G 5/00* (2006.01)

(52) U.S. Cl. .................................. 345/621; 345/622

(58) Field of Classification Search .................... 707/3; 345/418, 621, 622
See application file for complete search history.

(56) References Cited

U.S. PATENT DOCUMENTS

| | | |
|---|---|---|
| 5,425,109 A | 6/1995 | Saga et al. |
| 5,471,541 A | 11/1995 | Burtnyk et al. |
| 5,671,343 A | 9/1997 | Kondo et al. |
| 5,980,084 A | 11/1999 | Jones et al. |
| 5,990,897 A | 11/1999 | Hanratty |
| 6,026,189 A | 2/2000 | Greenspan |
| 6,047,041 A | 4/2000 | Ellinger |
| 6,061,065 A | 5/2000 | Nagasawa et al. |
| 6,215,493 B1 | 4/2001 | Fujita |
| 6,222,551 B1 | 4/2001 | Schneider et al. |
| 6,243,093 B1 | 6/2001 | Czerwinski et al. |
| 6,246,412 B1 | 6/2001 | Shum et al. |
| 6,301,763 B1 | 10/2001 | Pryor |
| 6,324,299 B1 | 11/2001 | Sarachik et al. |
| 6,326,964 B1 | 12/2001 | Snyder et al. |
| 6,362,817 B1 | 3/2002 | Powers et al. |
| 6,377,865 B1 | 4/2002 | Edelsbrunner et al. |
| 6,411,734 B1 | 6/2002 | Bachelder et al. |
| 6,434,442 B1 | 8/2002 | Kawamoto |

(Continued)

OTHER PUBLICATIONS

Tanaka et al. 3D Object Representation Using Spherical Harmonic Functions. Intelligent Robots and 10 Systems '93, IROS '93. Proceedings of the 1993 IEEF/RSJ International Conference. vol. 3, pp. 1873-1880. Jul. 26-30, 1993.*

(Continued)

*Primary Examiner*—Kee M Tung
*Assistant Examiner*—Jacinta Crawford
(74) *Attorney, Agent, or Firm*—Woodard, Emhardt, Moriarty, McNett & Henry LLP

(57) ABSTRACT

There are disclosed methods to provide stable pose determinations of various three dimensional shapes. Methods are also disclosed for determining multiple, unique drawing descriptors for two dimensional drawings, and for obtaining intermediate three dimensional representations of two dimensional drawings as one way to determine the descriptor. Methods are also disclosed to provide for searching of two dimensional drawings and three dimensional shapes using user-defined input, which may be a drawing or sketch. User interactivity is provided to further refine search results.

5 Claims, 36 Drawing Sheets

U.S. PATENT DOCUMENTS

| | | | |
|---|---|---|---|
| 6,441,816 B1 | 8/2002 | Nguyen et al. | |
| 6,512,995 B2 | 1/2003 | Murao | |
| 6,525,722 B1 | 2/2003 | Deering | |
| 6,532,394 B1 | 3/2003 | Earl et al. | |
| 6,549,201 B1 | 4/2003 | Igarashi et al. | |
| 6,578,017 B1 | 6/2003 | Ebersole et al. | |
| 6,611,725 B1 | 8/2003 | Harrison et al. | |
| 6,614,926 B1 | 9/2003 | Fix et al. | |
| 6,628,824 B1 | 9/2003 | Belanger | |
| 6,631,364 B1 * | 10/2003 | Rioux et al. | 707/2 |
| 6,636,211 B2 | 10/2003 | Chartier et al. | |
| 6,678,378 B1 | 1/2004 | Akiyoshi et al. | |
| 6,708,071 B1 | 3/2004 | Turner | |
| 6,741,248 B2 | 5/2004 | Raskar | |
| 6,744,434 B2 | 6/2004 | Kindratenko et al. | |
| 6,760,030 B2 | 7/2004 | Hiroike et al. | |
| 6,771,260 B1 | 8/2004 | Hazama et al. | |
| 6,771,276 B1 | 8/2004 | Highsmith et al. | |
| 6,801,882 B1 | 10/2004 | Fairman | |
| 6,804,416 B1 | 10/2004 | Bachelder et al. | |
| 6,831,643 B2 | 12/2004 | Aliaga et al. | |
| 6,847,462 B1 | 1/2005 | Kacyra et al. | |
| 6,898,548 B2 | 5/2005 | Flament et al. | |
| 6,914,618 B2 | 7/2005 | Weiss | |
| 6,928,331 B2 | 8/2005 | Wishengrad | |
| 6,935,748 B2 | 8/2005 | Kaufman et al. | |
| 6,937,235 B2 | 8/2005 | Fujiwara et al. | |
| 6,947,582 B1 | 9/2005 | Vilsmeier et al. | |
| 2001/0020946 A1 | 9/2001 | Kawakami et al. | |
| 2002/0067354 A1 | 6/2002 | Oh et al. | |
| 2002/0091679 A1 | 7/2002 | Wright | |
| 2002/0097910 A1 | 7/2002 | Guha | |
| 2003/0071810 A1 | 4/2003 | Shoov et al. | |
| 2003/0091225 A1 | 5/2003 | Chen | |
| 2003/0208285 A1 | 11/2003 | Regli et al. | |
| 2003/0220911 A1 | 11/2003 | Tompras et al. | |
| 2004/0003001 A1 | 1/2004 | Shimura | |
| 2004/0037463 A1 | 2/2004 | Calhoun et al. | |
| 2004/0064482 A1 | 4/2004 | Ikeda et al. | |
| 2004/0103093 A1 | 5/2004 | Furuhashi et al. | |
| 2004/0150640 A1 | 8/2004 | Park et al. | |
| 2004/0151349 A1 | 8/2004 | Milne et al. | |
| 2004/0167833 A1 | 8/2004 | Schickler | |
| 2004/0243483 A1 | 12/2004 | Baumann et al. | |
| 2004/0249809 A1 | 12/2004 | Ramani et al. | |
| 2004/0252889 A1 * | 12/2004 | Liu et al. | 382/190 |
| 2005/0062738 A1 | 3/2005 | Handley et al. | |
| 2005/0107958 A1 | 5/2005 | Park et al. | |
| 2005/0168460 A1 * | 8/2005 | Razdan et al. | 345/419 |

OTHER PUBLICATIONS

Srikanth Devanathan and Karthik Ramani, "Towards Configuration Aided Design (CoAD)," (Purdue Research and Education Center for Information Systems in Engineering (PRECISE), Purdue University, West Lafayette, IN 47907-2024), 33 pages.

Srikanth Devanathan et al., "Design Space Exploration for Rapid Product Realization", Purdue Research and Education Center for Information Systems in Engineering (PRECISE), Purdue University, West Lafayette, IN 47907, USA.

Kazhdan et al. Rotation Invariant Spherical Harmonic Representation of 3D Shape Descriptors. Eurographics Symposium on Geometry Processing 2003.

Patent Application Extended Search Report mailed on Feb. 7, 2008.

Tanaka et al. 3D Object Representation Using Spherical Harmonic Functions. Intelligent Robots and Systems '93, IROS '93. Proceedings of the 1993 IEEE/RSJ International Conference. vol. 3, pp. 1873-1880. Jul. 26-30, 1993.

* cited by examiner (a)

(b)

(c)

(d)

(a)  (b)

METHODS FOR RETRIEVING SHAPES AND DRAWINGS

CROSS REFERENCE TO RELATED APPLICATIONS

The present application claims the benefit of U.S. Provisional Patent Application Ser. Nos. 60/631,468 filed Nov. 29, 2004, and 60/664,005 filed Mar. 21, 2005, with both of said priority applications being incorporated herein by reference in their entirety. This application is related to "A Retrieval Framework Bridging the Gap between 2D Drawings and 3D Models" by Jiantao Pu and Karthik Ramani, "On Visual Similarity Based 2D Drawing Retrieval" by Jiantao Pu and Karthik Ramani, and "Similar 3D Shape Retrieval Based on Multi-Level Details" by Karthik Ramani and Pu Jiantao, all of which are hereby incorporated by reference in their entirety.

BACKGROUND

In the field of engineering, commonly drawings and models of parts or structures are used for explanation of how the apparatus works, for indication of how to construct the apparatus, or for other purposes. Such drawings and models may be graphically represented and stored in electronic versions, as in a computer system, and such systems may be used to operate on or analyze them.

Databases of such drawings and models may have value insofar as they provide the engineer building blocks for a project or otherwise provide information for the engineer. However, searching for and retrieving such information can be difficult and time consuming, and can provide results (e.g. parts or shapes) that are not what is sought by the engineer.

BRIEF DESCRIPTION OF THE DRAWINGS

Although the characteristic features of this invention will be particularly pointed out in the claims, the invention itself, and the manner in which it may be made and used, may be better understood by referring to the following description taken in connection with the accompanying figures forming a part thereof.

DETAILED DESCRIPTION

Figure 1:
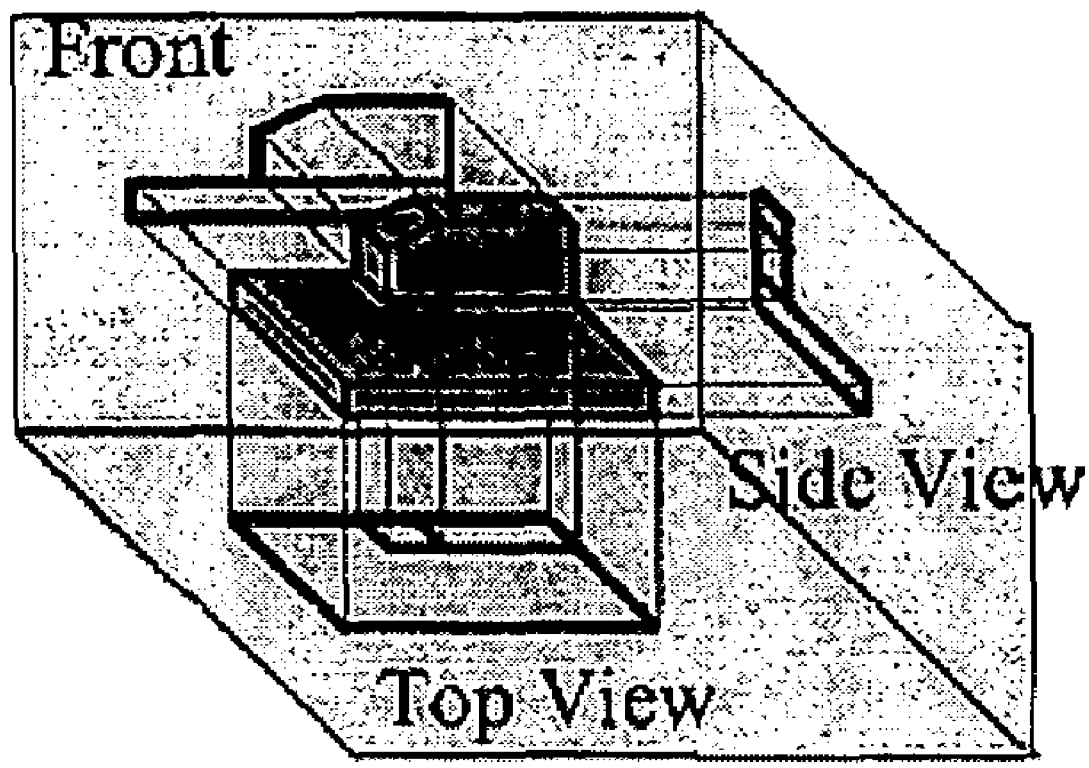
FIG. 1 shows the projection of 2D images from a 3D model.

For the purposes of promoting an understanding of the principles of the disclosure, reference will now be made to the embodiments illustrated in the drawings and specific language will be used to describe the same. It will nevertheless be understood that no limitation of the scope of the claims is thereby intended, and alterations and modifications in the illustrated devices, and further applications of the principles of the disclosure as illustrated therein are herein contemplated as would normally occur to one skilled in the art to which the disclosure relates.

The techniques and methods disclosed herein are, generally speaking, aimed at providing ways to effectively and efficiently analyze and access drawings and models, and in particular embodiments drawings and models of apparatus such as consumer products or machine parts. In these methods, particular emphasis is placed on proper posing of three-dimensional (3D) models, creating two-dimensional (2D) projections and/or descriptors of them that can be compared to other 2D drawings or descriptors, comparing input parameters to such models, projections and/or descriptors, and presenting models or drawings that most closely meet such input parameters.

The techniques presented herein enable a user to search similar models from a large repository of 3D models and 2D drawings using 2D input. As used herein for convenience of description, the term "2D input" is intended to encompass any 2D depiction including, but not limited to, sketches drawn by hand or with the aid of computer, drawings, flowcharts, diagrams, tablets, etc. Engineers usually express their concept of a 3D shape in 2D views. This process can be illustrated by FIG. 1. Front view reflects the left-right and top-down relationships of shape of 3D models, top view the left-right and front-back relationships, side view the top-down and front-back relationships. By these relationships and views, engineers can manufacture the desired mechanical parts correctly without missing any information.

Figure 2:
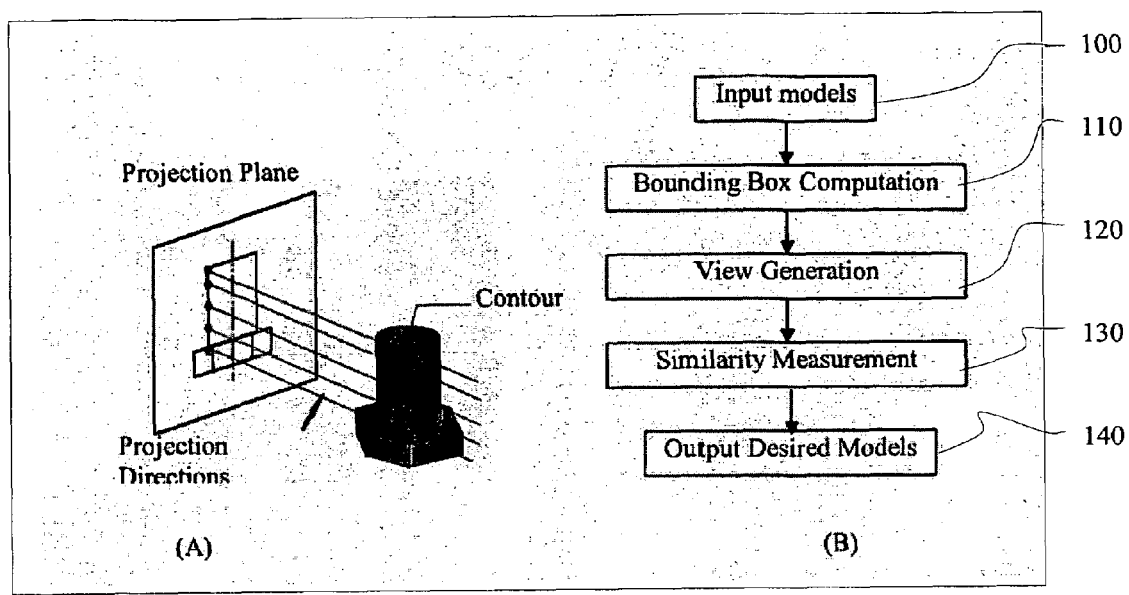
FIG. 2A and 2B are representations of an embodiment of a method using a 3D model projected onto a 2D plane.

Among the areas addressed herein are methods of (1) determining projection plane and directions, (2) generating views, and (3) measuring similarity. Referring generally to FIGS. 2(a) and 2(b), one way to determine the projection planes and directions is to find a robust bounding box that is in accordance with a human's perception mechanism. The aim is to simulate the drawing process in which engineers express a 3D shape concept on a piece of paper. For general purposes, 3D polygon meshes are used to represent 3D models, and shape contours are needed for view generation. Once 2D views are obtained, the similarity between corresponding views can be computed.

General Description

Figure 3:
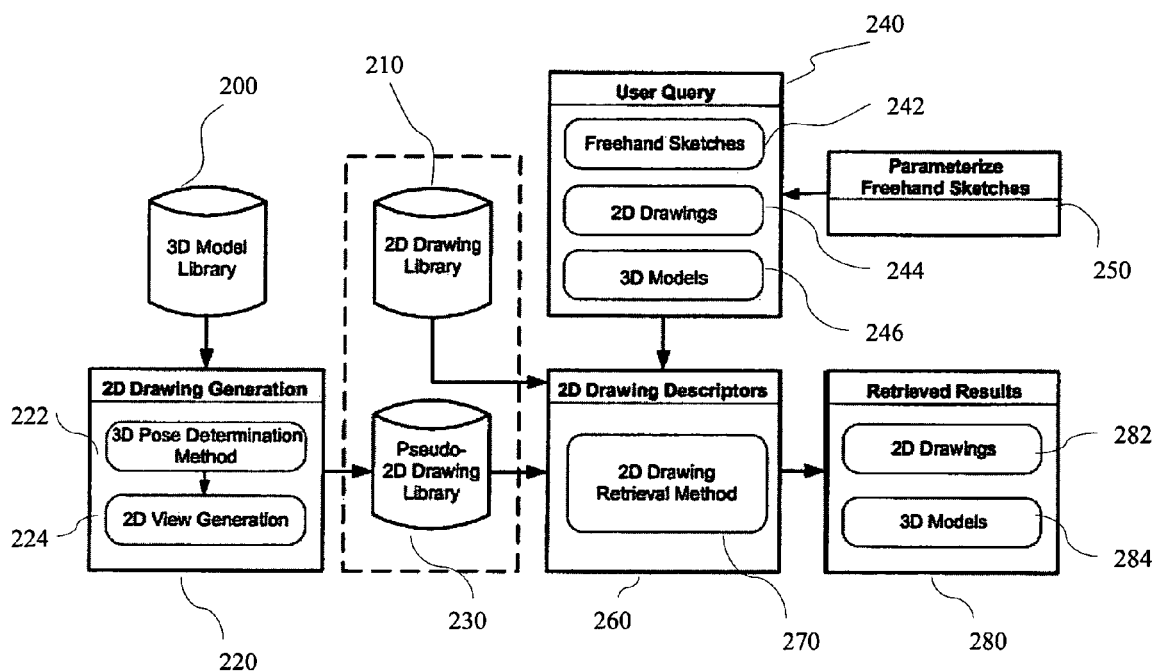
FIG. 3 is a schematic representation of an embodiment of a drawing and/or model analysis and retrieval system.

An embodiment of an architectural arrangement for shape generation, orientation, and translation is shown schematically in FIG. 3. The components of the architecture are implemented in a machine-accessible and/or readable medium and are accessible over a network. The network may be wired, wireless, or a combination of wired and wireless. The various components and techniques include: (1) 2D drawing generation; (2) 2D drawing descriptors; (3) user queries; and (4) shape retrieval results.

(1) "2D Drawing Generation": This bridges the gap between 3D models and 2D drawings by representing 3D models in the form of three orthogonal drawing-like views. Two functions, 3D pose determination and 2D view generation, may be included. The first function unifies the space between 2D drawings and 3D models by finding a set of robust orthogonal orientations (a pose) along which designers usually depict 3D models in the form of 2D drawings. The second function sets up the correspondence between 2D drawings and 3D models by generating orthogonal drawing-like views or projections from 3D models along the pose orientations. Consequently, both 3D models and 2D drawings can be compared as 2D drawings. The dashed box in FIG. 3 illustrates this generation. A more detailed explanation is provided herein and below.

(2) "2D Drawing Descriptors": To describe the shape in a 2D drawing, descriptors are defined. Two embodiments of methods are presented to extract rotation descriptors of a 2D drawing. Both of these methods can provide a compact representation of a 2D drawing. These methods are efficient and have good discriminative ability and can be applied to vector drawings and scanned drawings. Since the two proposed methods are not insensitive to noise and the similarity measurements are conducted in 2D space, they can also handle the drawings formed by freehand sketches. A more detailed explanation is presented herein and below.

(3) "User Query": To retrieve 3D models and 2D drawings, three query methods are provided for designers, that is, by 2D drawings, 3D models, and freehand sketches. For example, designers can retrieve 3D models by inputting 2D drawing information, 3D model information, or freehand sketch information since the 2D space is the final unified space for comparison. It is easier for designers to express shape intention in 2D space than in 3D space.

(4) "Retrieved Results": The final retrieved results can be 2D drawings or 3D models, and they are ranked according to their similarities with the input query.

2D Drawing Generation

Turning now to the matter of posing, or orienting, a model or a 3D shape, there are various representations of such shapes or models, such as solids, parametric surfaces, point clouds and polygon meshes. A 3D object as a polygonal surface model with uniform mass distribution is one example considered herein. For smooth curved surfaces, the object can be approximated by multiple polygon patches.

On the basis of this representation, the pose determination step can generally be described as follows. Where a model is not built with CAD software and therefore does not have pre-defined viewing directions, such as with models built with digitizing tools such as scanners, we have to determine the desired pose that is in accordance with most designers' perceptions. Thus, given a 3D shape S represented by a series of polygons $p_i$ ($0 \leq i \leq n$), a bounding box is found with three orthogonal axes (X, Y, Z) that encloses S and meets the criterion that similar shapes have similar bounding box orientations which should be in accordance with human perception. It is noted that the same bounding boxes with different axes mean different poses, i.e., given an object, the orientation with orthogonal axes (X, Y, Z) is different than the orientation with axes (–X, Y, Z). The criterion can be used to align similar objects correctly and assure similar objects have similar orientation. In a particular embodiment, a unique bounding box that encloses a three-dimension model tightly is found so as to determine projection planes and directions. The side-directions of the bounding box can be regarded as the projection planes, while the normals are the projection directions.

To find a bounding box, a technique dubbed maximum normal distribution (MND) can be used. As the name suggests, the maximum normal distribution (i.e. the greatest of the distributions of normals to polygons of a 3D shape) is used as one of the principal axes.

The polygons of a representation of a 3D shape are separable into triangles. As an initial matter, the normal direction $N^k$ for each triangle $\Delta p^k q^k r^k$ is computed and normalized. It is the cross product of any two edges:

$$N^k = \frac{p^k q^k \times q^k r^k}{\|p^k q^k \times q^k r^k\|} \quad (1)$$

Second, the area of each triangle $a^k$ of the polygonal representation of the 3D shape is calculated and the sum of the areas of all triangles with same or opposite normals are computed. Here the normals that are located in the same direction belong to a particular distribution.

Next, the three principal axes are determined. From all of the normal distributions, the normal distribution with maximum areas is selected as the first principal axis $b^u$. To get the next principal axis $b^v$, we can search the remaining normal distributions and find the one that has maximum areas and is orthogonal to the first normal. Naturally, the third axis can be obtained by obtaining the cross product between $b^u$ and $b^v$: $b^w = b^u \times b^v$.

Figure 4:
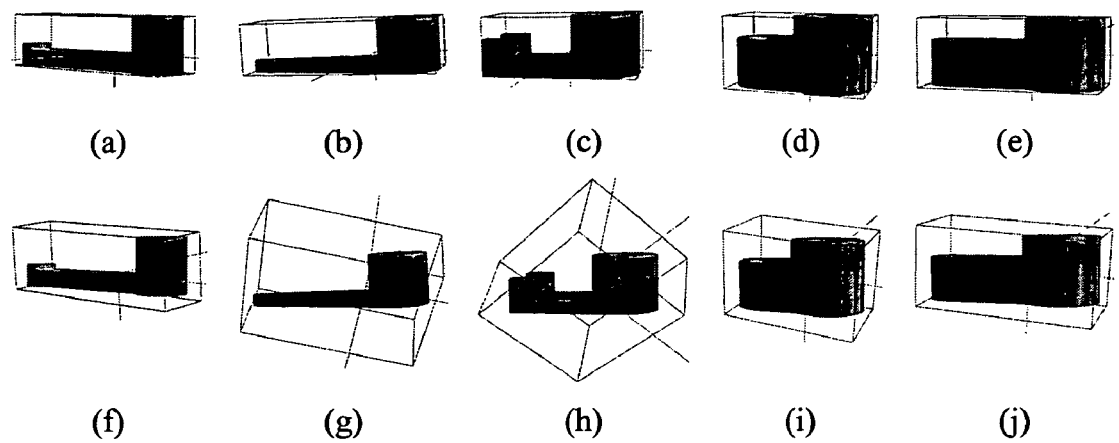
FIG. 4 shows a comparison of different posing methods.
Figure 5:
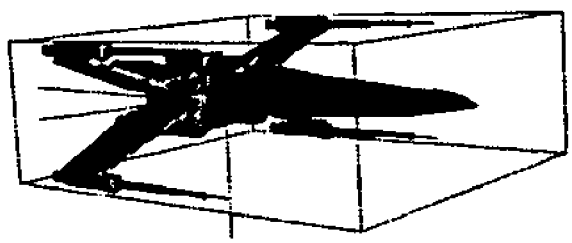
FIG. 5 shows a comparison of different posing methods.
Figure 5:
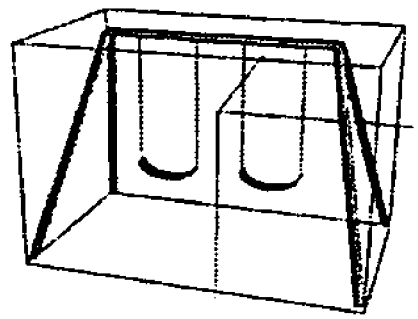
Figure 5:
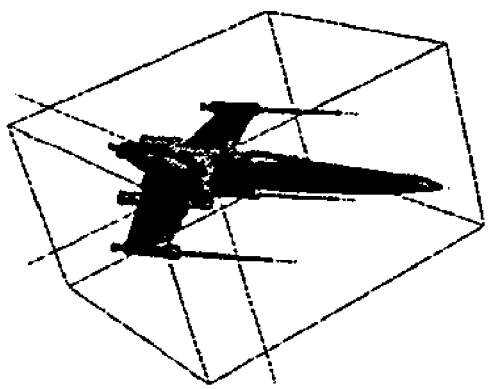
Figure 5:
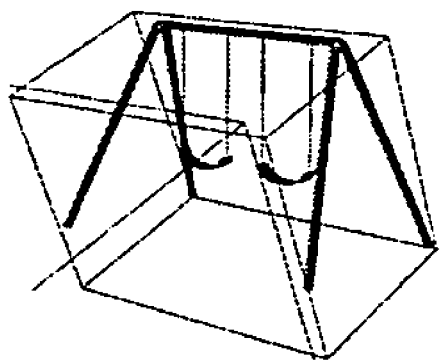

Finally, the center and the half-length of the bounding box are calculated. As an example, the center and half-length can be defined by Equation (15) and half the longer diagonal length of the bounding box. In FIG. 4, the boxes shown in bottom row are obtained by the MND method. For the similar models shown in FIG. 5, the bounding boxes are consistent with each other.

Maximum normal distribution sorts the normals according to their direction, which can take a relatively long time since the normal is represented as a vector. Thus, for cases where the number of polygons contained in a model is large, an algorithm for bounding box generation without sorting the normal is provided. An approximate method with the time complexity O(n) can be used. It is based on eight 2D look-up tables with a space complexity O(n$^2$). Although just a 3D look-up table can be enough, the space requirement (O(n$^3$)) is too great to be acceptable if the precision is desired to be high. Generally, if the errors between three elements of some normal vectors are all less than 0.001 radians, then they are regarded as the vectors with the same direction. The basic steps of an embodiment of this algorithm are:

(1) Set up eight 2D look-up tables and initialize them as value 0. They are used for the eight coordinate districts divided by the three axes X, Y, Z respectively. Each table is represented by a 2D array with 1000×1000 discretization based on elements.

(2) Put the normals into different tables according to their values along three axes. The position is determined by multiplying 1000 to the elements along X, Y, Z axes respectively. The value is determined by the polygon area with the respective normal. If there are more polygons with same position in the 2D array, then their areas are summed together.

(3) Traverse the eight tables and find the element with the maximum values, and the corresponding normal is regarded as the first direction. After this, the value at this position is set to zero. Repeat this step and find the next maximum value that satisfies the constraint that its normal is orthogonal to the normal of the first direction.

(4) The result of the cross product of the above two normals is regarded as the third direction. The three directions can be regarded as the three directions of the bounding box.

In the above process, there is no sorting operation involved. The time complexity is O(n) and the space complexity is O(n$^2$).

Figure 6:
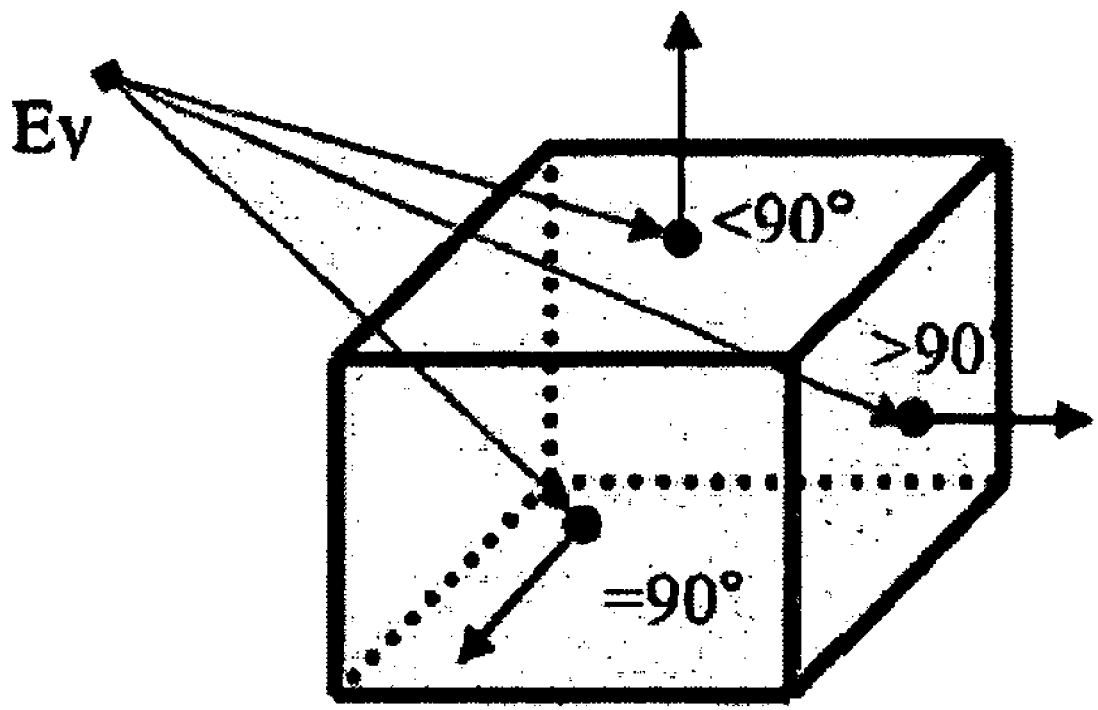
FIG. 6 is a diagram representing four transitions to view generation, according to an example embodiment.

For models without readily apparent normal distributions, as shown in FIG. 6, an Inertial Principal Axes (IPA) method can be used to obtain the bounding box. When there is no readily apparent normal distribution for a 3D shape, it will mean that the model has an arbitrary surface. It could be difficult to determine the projection directions and planes. In this case, one can use the mass distribution of the 3D shape to find a stable bounding box. The validity of this criterion has been verified by more than 1700 models in our 3D model library.

Figure 7:
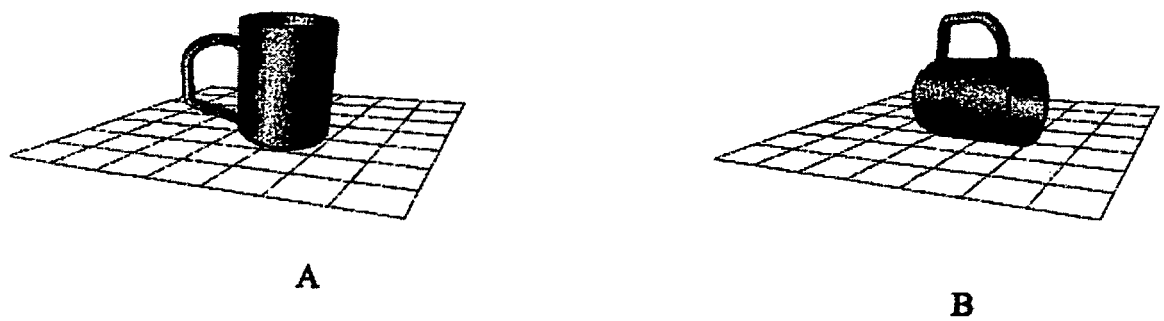
FIG. 7 shows orientations of an example 3D model.

In another embodiment, an orientation determination method based on stability analysis can be used. It arises from the premise that a human being tries to place an object at the most stable orientation and similar objects will own similar stable orientations. This concept can be explained by the examples shown in FIG. 7. It is natural for human being to place the "cup" object in the orientation shown in FIG. 7(A), because this position is more stable than the one in FIG. 7(B). To determine the stable orientations, static equilibrium conditions and concepts of physical stability can be used to determine pose orientations.

Figure 8:
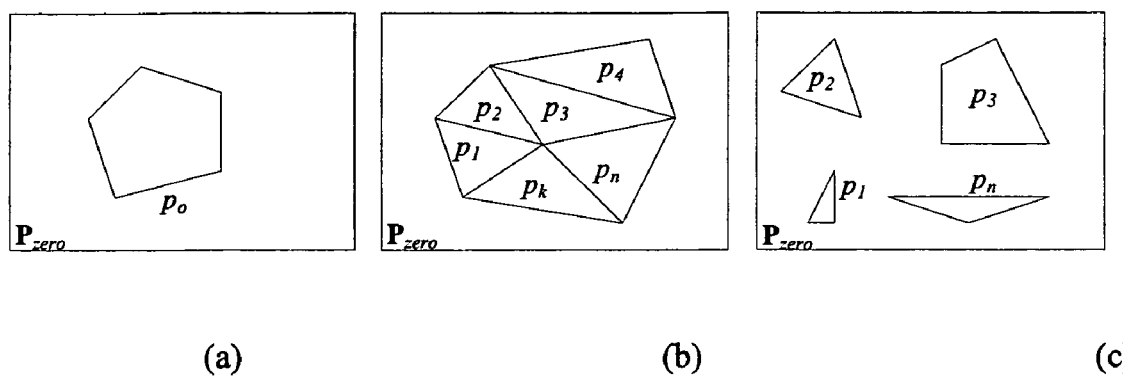
FIG. 8 shows examples of polygonal area arrangements.

Given a 3D polygon model and a horizontal plane $P_{zero}$, there are three kinds of contacts between this model and the plane, as FIG. 8 shows. For the first two cases in FIGS. 8(a) and 8(b), the contact area is the summed areas of all the contact polygons since they connect with each other. However, for the case shown in FIG. 8(c), the contact area is formed by the dispersed polygons with the horizontal plane. For the cases where the contact surface area is formed by several non-connected polygons, the area bounded by these polygons is defined as virtual contact area (VCA). For simplicity, regard the cases shown in FIGS. 8(a) and (b) as special cases of FIG. 8(c).

Figure 9:
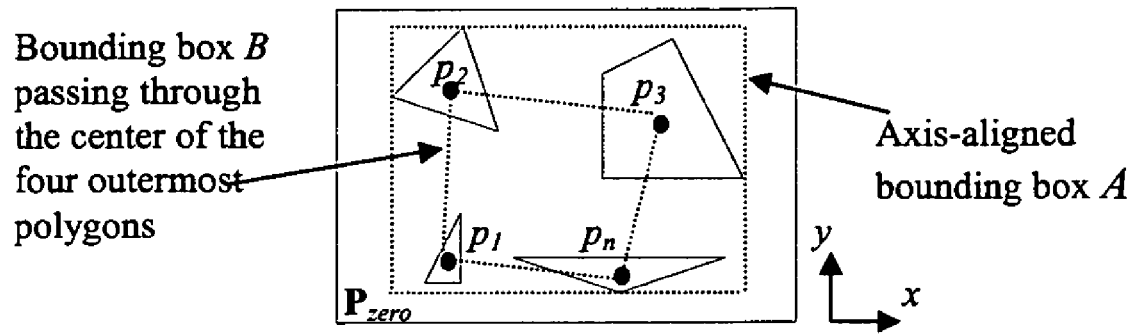
FIG. 9 shows an example of contact area calculation.

For the sake of computation efficiency, an embodiment of VCA disclosed herein uses an approximating strategy. For generality, this problem can be represented as shown in FIG. 9. Since it is not easy to determine the region of VCA, use the average area of two bounding boxes to approximate the contact area. The first box is an axis-aligned bounding box A, whose corners are determined by the minimum and maximum coordinates along x and y axes:

$$A=\{top=\max\{y_i\}, left=\min\{x_i\}, bottom=\min\{y_i\}, right=\max\{x_i\}|\{x_i,y_i\}\epsilon p_m, 0\leq m\leq n\} \qquad (2)$$

The second bounding box is a quadrilateral B whose four corners pass through the centroids of the four outermost polygons. The outermost polygons are determined by the distances from the respective four corners of the bounding box A to the center of the polygons.

The final contact area C is approximated as the average of quadrilateral A and B:

$$C = \frac{\text{area}(A) + \text{area}(B)}{2} \qquad (3)$$

As noted above, generally a 3D shape S can be represented as a 3D mesh composed of a series of discrete 2D polygons $p_i$ ($0 \leq i \leq n-1$) with uniform density. In order to efficiently figure out the contacted polygons of a 3D object along a certain direction, a triple $S=\{p_i|(N_i, A_i, D_i), 0\leq i\leq n-1\}$ is used to represent a 3D shape, in which $N_i$ represents the normal of polygon $p_i$, $A_i$ represents the area of polygon $p_i$, and $D_i$ represents the signed distance between the mass center C and the polygon $p_i$. In other embodiments, $D_i$ can be the distance between any predefined origin in 3D space and the polygon $p_i$. The mass center is adopted as the origin for the sake of simplicity.

To transform a 3D object S into a series of triple representations $S=\{p_i|(N_i, A_i, D_i), 0\leq i\leq n-1\}$, the mass center C of this object as well as the normal $N_i$, the area $A_i$ and the distance $D_i$ for each polygon $p_i$ is calculated. Given a polygon mesh, which contains n triangles defined as $\Delta p_i q_i r_i$, where $p_i$, $q_i$ and $r_i$ are the vertices of triangle i, $0\leq i\leq n-1$, if the area of triangle i is represented $A_i$, then the total area of the convex hull can be denoted as $$A_H = \sum_{i=0}^{n-1} A_i$$

and its centroid is $c_i=(p_i+q_i+r_i)/3$. The centroid of this polygon mesh can be represented as $$C = \frac{1}{A_H} \sum_{i=0}^{n-1} A_i m_i \quad (4)$$

where $A_i = 0.5 \times \|p_i q_i \times r_i q_i\|$.

The normal $N_i$ is the cross product of any two edges:

$$N_i = \frac{\vec{p_i q_i} \times \vec{r_i q_i}}{\|\vec{p_i q_i} \times \vec{r_i q_i}\|} \quad (5)$$

The signed distance $D_i$ is equal to the signed projection of the vector from vertex $p_i$ to the mass center $C$ along the normal $N_i$:

$$D_i = \vec{p_i C} \cdot N_i \quad (6)$$

Thus, values for each normal vector $N_i$ and distance $D_i$ are obtained.

To obtain the orientation along which the virtual contact area is the maximum, the polygons that have the same normal and same distance to the mass center are used to calculate the virtual contact area. The normal direction associated with the maximum virtual contact area is selected. This obtained normal is also the first principal axis $b^u$ of the 3D object orientation. The C style pseudocodes for this step are summarized in Table 1.

TABLE 1

Orientation determination algorithm

```
*1   for ( i = 0; i <n; i++ ) {
*2     TA_i = A_i; D_o = D_i;
*3     for ( j = i; j < n; j++ ) {
*4       if ( ( N_i = = N_j ) && ( ( D_o = = D_j ) ) {
*5         TA_i += A_j;
*6       }
*7     }
*8   }
*9  }
*10  TA_k = max { TA_i , 0≦i≦n-1};
*11  N_final = N_k;
```

$TA_i$ is the summed area along the normal of the $i^{th}$ polygon. $D_o$ is a middle variable. "*3~*8" compute the summed area $TA_i$ with the same normal and same distance. "*10" is to find out the normal associated with the maximum summed area and its computation complexity is O(n). It can be concluded from the above pseudocodes that the total computation complexity is $O(2n+0.5n^2)$. When an object contains too many polygons (e.g., $10^5 \sim 10^6$), the computation load will be heavy.

Figure 10:
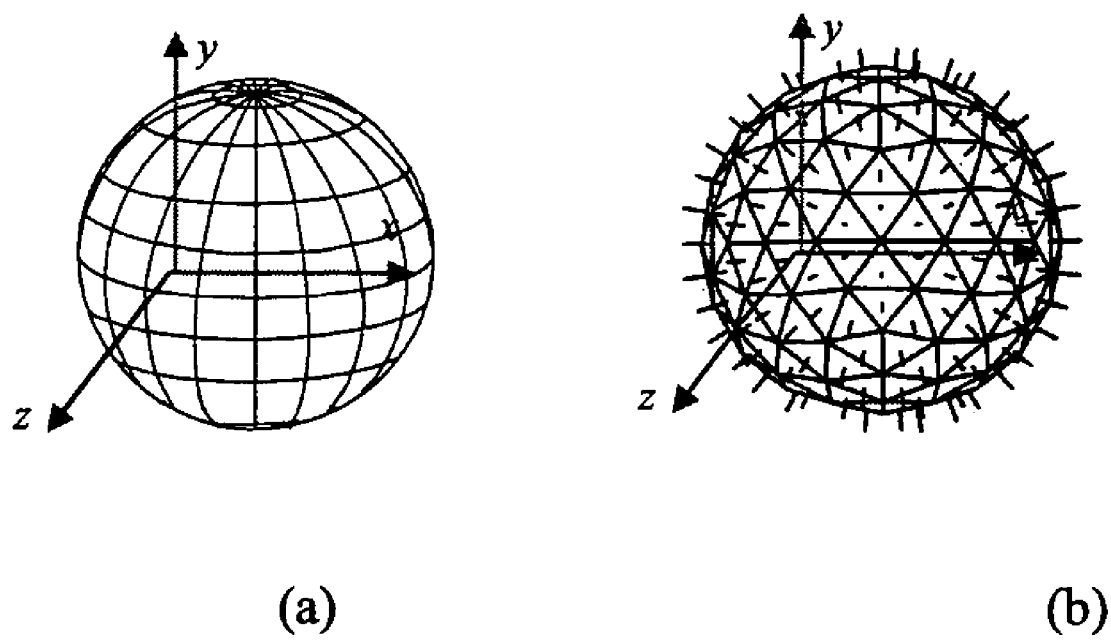
FIG. 10 shows embodiments of two different tessellation schemes, one along latitude and longitude and the other based on regular polyhedra.

To accelerate this process, a look-up table-based algorithm can be used with a computation complexity O(n+C), where C is a constant. As an approximating approach, this method divides the normal space $NS=\{(x_i, y_i, z_i)|0\leq x_i\leq m, 0\leq y_i\leq m, 0\leq z_i\leq m\}$ into eight different regions along the x, y, and z axes (or an octant), and each region is further divided into m subspaces with uniform intervals along the x and y axes. This process is similar to a tessellation process that divides a unit sphere along the latitude and longitude uniformly, as FIG. 10(a) shows. Each of the octants has $m^2$ surface patches. The normals that fall into the same surface patch are regarded as the same normal. Therefore, instead of comparing every two normals of all the polygons, all the normals are classified by traversing each polygon and checking which surface patch it belongs to. In this process, these patches act as a look-up table. This modified algorithm is summarized in Table 2 in the form of C style pseudocodes.

TABLE 2

An improved algorithm based on a look-up table

```
*1   Initialize( NormalSpace[8][m] [m] );
*2   for ( i = 0; i <n; i++ ) {
*3     row = (int) N_i.x×m; col = (int) N_i.y×m;
*4     D_o = D_i;
*5     Bin = WhichOctant(N_i);
*6     if ( D_o = = D_j ) {
*7       NormalSpace[Bin][row][col] += A_i;
*8     }
*9   }
*10  max { Area(NormalSpace[Bin][row][col]) };
*11  N_final = {x=sign(row/m), y= sign(col/m), z=sign(sqrt(1-x^2-y^2) );
```

"*1" builds a look-up table that represents the eight discrete normal space NormalSpace[8][m][m]. m is the dividing number along the x and y axes for each region of the octant. "*2~*9" check in which surface patches a normal lies and summarize the areas with the same normal and same distance to the mass center. The computation complexity is O(n). "*10" searches from this look-up table and finds the surface patch with the maximum area. The computation complexity is $O(8m^2)$. From this patch, determining the region in which this patch is located tells us the signs of the x, y and z values of the normal. It is worth noting that for each region only discretize the x and y values, as "*3" shows, because the z value can be derived from the x, y and the region (as "*11" shows). The total computation complexity is $O(n+8m^2)$. Total computation complexity depends on the precision along the x and y axes. If the precision is fixed, the computation complexity is almost the same for all objects with different complexity.

In this tessellation scheme, the discrete patches that constitute the sphere surface are not uniform. However, with the improved division resolution is provided so that the divided patches on the sphere will become more similar to each other. A division number of 1000 can be used. The scheme can be used because it is easy to decide in which cell a particular surface normal locates and the projection computation involved in the regular polyhedron based method is not needed.

To get the next principal axis $b^v$ of an object orientation, search the look-up table again and find the normal that satisfies two conditions: (a) with maximum areas; and (b) orthogonal to the first principal axis. Naturally, the third axis can be obtained by doing cross product between $b^u$ and $b^v$:

$$b^w = b^u \times b^v \quad (7)$$

To evaluate the validity of the VCA method, it was tested against 3D models from industry and Princeton's benchmark for 3D model retrieval. At the same time, some comparisons with some other methods (including the Principal Component Analysis (PCA), Extended Gaussian Image (EGI) and Complex Extended Gaussian Image (CEGI) methods) were conducted. In FIG. 4, (a)~(e) show the orientations for a set of similar objects which are obtained by the method disclosed herein. It is seen that similar models have similar orientations. However, (f)~(j) are the orientations obtained by the PCA method, and they differ greatly although their shapes are similar.

The methods disclosed can retrieve orientations more similar to human perception than the EGI & CEGI methods. For example, in FIG. 5, the top row shows the results obtained by the method disclosed, while the bottom row shows the results by the EGI & CEGI methods. The reason lies in that the introduced concept named VCA can incorporate these structural shapes into one uniform framework with the help of stability analysis.

Figure 11:
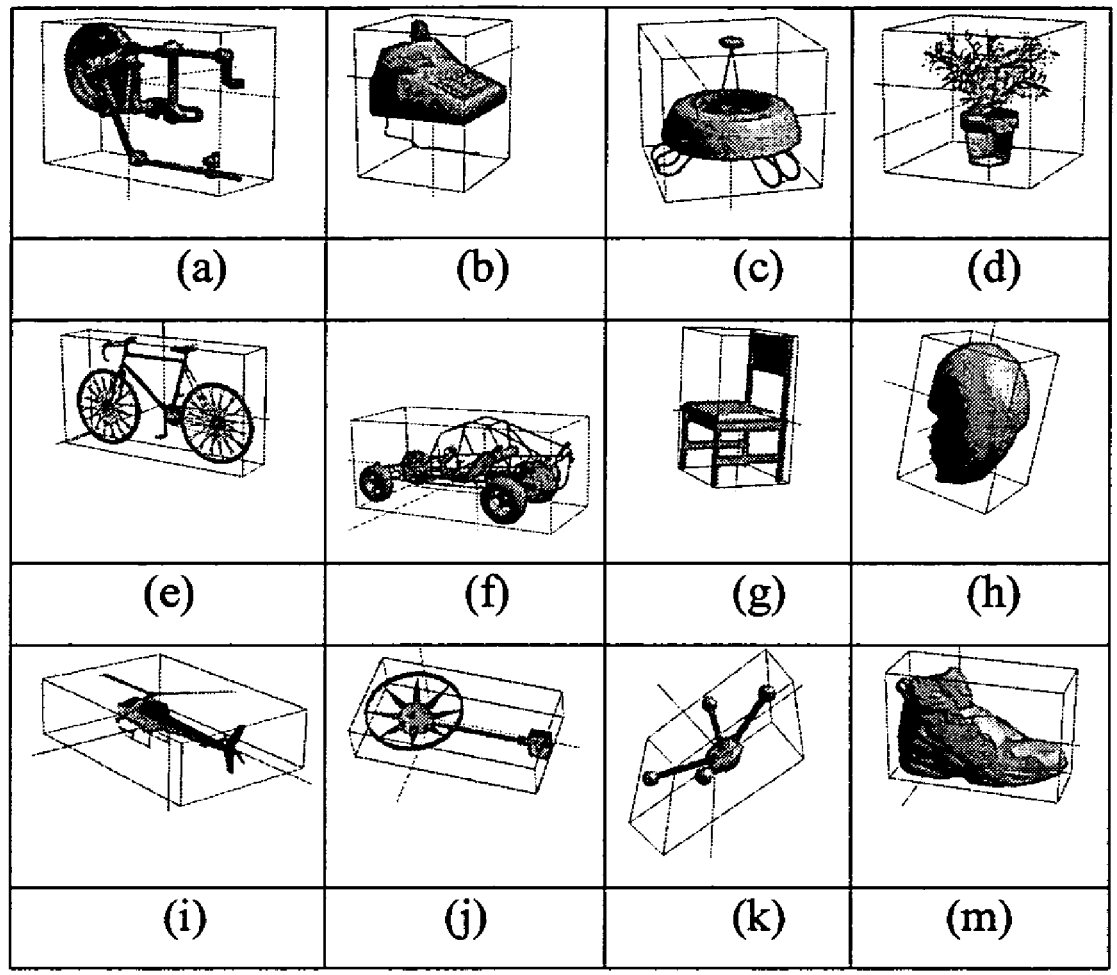
FIG. 11 shows example orientation determinations.

In FIG. 11, some examples from different domains are presented to show the generality of this proposed method. Some objects are formed by different parts, such as (a), (e) and (f). The plant object in (d) shows the robustness of this method since the leaves can be regarded as some noise.

On the basis of these experiments, it is seen that:
(1) Similarity: methods disclosed herein can find orientations of a 3D model which is in good accordance with human perception and it can obtain similar orientations for similar shapes.
(2) Robust: the methods are not sensitive to small local shapes or noises. For example, if a line of the cash machine is changed in FIG. 11(b), the orientation does not change respectively.
(3) Generality: these methods can be used to calculate the orientation of a 3D model from many domains.
(4) Efficiency: the total computation complexity is $O(n+m^2)$, in which n is the number of the polygon contained in an object and m is the division number along x and y axes.

Projections and Descriptions

Turning now to the matter of projecting 2D images of 3D models onto the planes of a bounding box, the aim is to create multiple 2D representations of a given 3D model. One such representation is analogous to a type of representation engineers use to represent 3D objects using 2D views. This type of representation can be referred to as the full view and is one in which all the features, outside as well as hidden, are displayed. Another type of representation can be used to display only the outside features; this type can be referred to as the silhouette view. Yet another type of view, called the contour view, can be used to depict the edges of the shadow cast by a 3D model. At the contour level, there are three different views along the principal axes; at the silhouette level, there are six different views; and at the full level there are three different views along the principal axes. The representations of contour, silhouette and full level can be determined with the aid of a CAD system using predefined coordinate axes, or could be machine determined using the techniques described. Drawings and models in a CAD system typically have axis systems predefined by a user, and if no such axes exist then the disclosed methods can be used to define the axes. For example, a point cloud may have an arbitrary axis system that can be rotated to provide new axes using the techniques described. After the axis system has been rotated the contour, silhouette and full levels can then be determined.

Turning now to a description of the drawing descriptors, there is described a statistics-based 2D shape distribution that is invariant to the scale, rotation, and orientation of 3D models. The problem of 2D drawing retrieval is related to 2D shape recognition, and can be defined as: given a drawing A and a drawing library $L=\{B_i|0 \leq i \leq n\}$, how to compute the similarity distance A and $B_i$, i.e., $D(A, B_i)$, and find the k-nearest drawings within a certain tolerance $\epsilon$.

Figure 12:
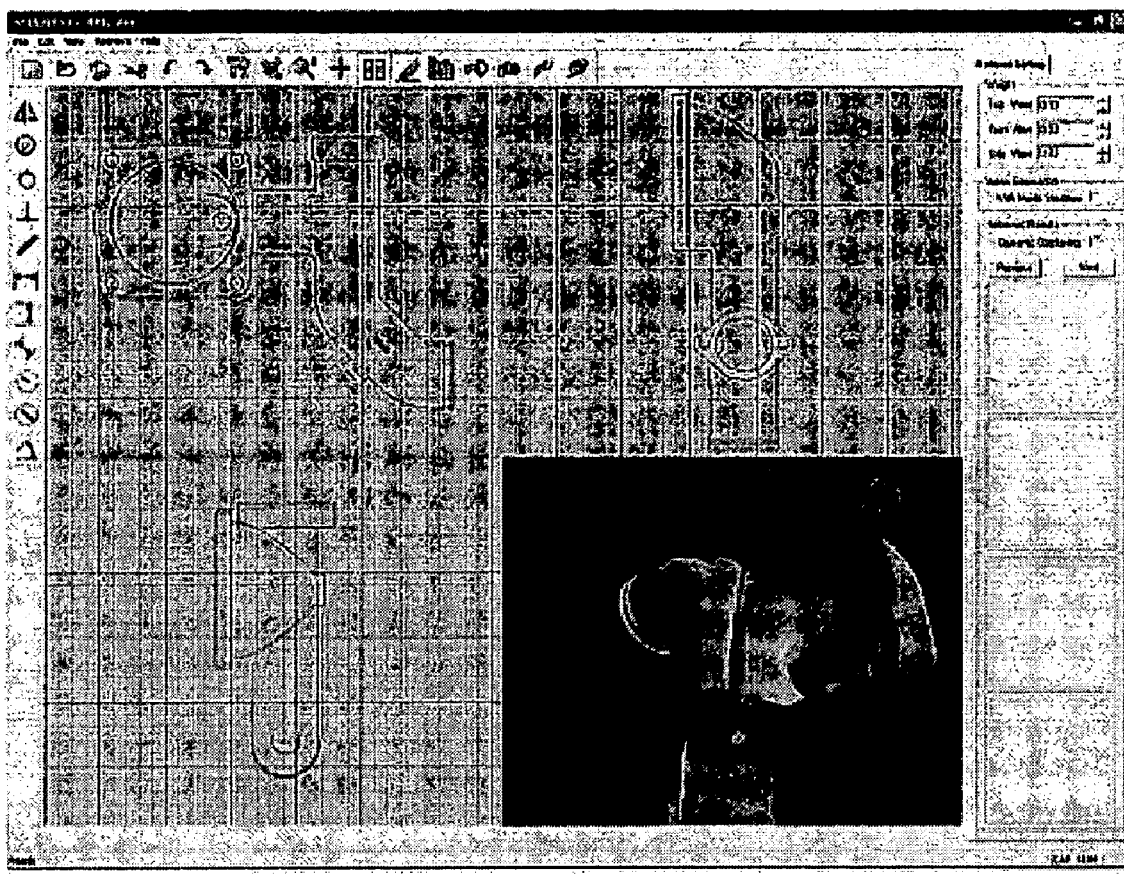
FIG. 12 shows an example user interface with an example model and example drawings.

In one embodiment, after steps are taken to pose and project images of the 3D model, using methods such as those described above, the 3D shape-matching problem is transformed into how to measure the similarity between 2D views, which can be illustrated by FIG. 12. A two-dimension shape distribution method is presented herein to measure the similarity between 2D views. It can be regarded as a kind of derivation from the 3D case. In other words, the similarity between views can be obtained by measuring their 2D shape distributions. Like the 3D case, one embodiment of a process to compute the degree of the similarity between 2D shapes can be summarized as three steps.

One step is random sampling on view edges. The views are formed by a series of line segments. Some of them may overlap with each other. For the sake of convenience, adopt a random sampling principal: select a line segment from the view randomly, then pick a point on the line segment randomly and save it into an array named S. During this process, the random generator plays an important role. It is designed with the ability to generate random numbers greater than one million because we define one million samplings. But the system function rand( ) in windows platform can only generate numbers less than 32768, and therefore a new random generator is designed by using rand( ) twice: MyRand( )=rand( )×32768+rand( ).

Figure 13:
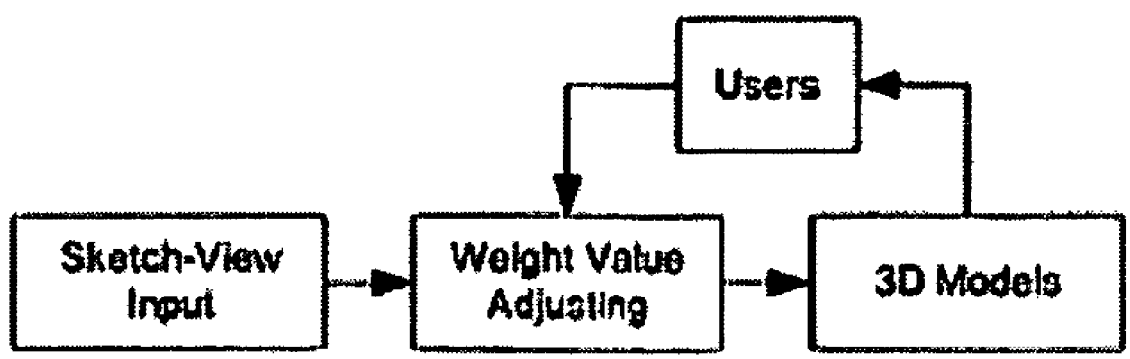
FIG. 13 is a flowchart showing an embodiment of a user-feedback method.

Another step is shape distribution generation. The Euclidean distance between two random sampled points is chosen to measure the shape features of polygons because other distance metrics are designed specially for 3D cases. By summarizing the numbers of point pairs with same distance, the 2D shape distribution can be generated. FIG. 13 shows the two distributions formed by the views in FIG. 12. From the visual appearance, the two views are different greatly. The next step is to quantify this difference.

A final step is similarity measuring. Due to the fact that two different models may be of different size, a normalization step has to be taken to measure their difference on the basis of one common standard. Generally, two normalization methods are available: (a) align the maximum D2 distance values, and (b) align the average D2 distance values. For the first normalization method, the maximum values of the two shape distributions have to be adjusted to one same value, which is used to normalize the shape distribution. The other one is to use the mean value of distance to normalize the shape distribution. To alleviate the influence of high-frequency noise, the second one is adopted as the normalization standard. The similarity between two views can be obtained by calculating the difference between their distributions in the form of a histogram. The Minkovski distance is used due to its simplicity, which can be expressed as $$\text{Similarity} = \sum_{i=0}^{n} (s_i - k_i)^2 \quad (8)$$

where n is the divided histogram number of the shape distribution curve, s, and k is the probability at certain distance. The 2D shape distribution approach has the same advantages as the 3D case. It is simple and easy to implement, and it also has some unique properties which are: (1) insensitivity to geometric noise; (2) invariance to translation, rotation and scaling; and (3) lack of necessity to find out the feature correspondences between models.

To measure similarity between models that have multiple ortho-views, an additional step is needed. Its aim is to find out the correspondences between views of two models. If the view generation step is carried out without the step of culling the occluded triangles, then there are only three different views because the views generated from positive and negative directions are the same. If the step of culling the occluded triangles is taken, then there are six different views in which the projections along different directions are not the same because the internal structure is not taken into account. To determine the partnership of one view, compare it with all the views of another model and select the most similar one as the corresponding view. In this way, the views from different models can be grouped into a series of pairs. By adding the similarities of these view pairs together, the similarity between models can be obtained. Experiments below show that the method with the step of culling the occluded triangles can achieve a better retrieval performance.

Embodiments for two methods for computing the shape similarity between 2D drawings are disclosed. The first approach represents a drawing as a spherical function by transforming it from 2D space into 3D space and then employs a fast spherical harmonics transformation to get a rotation invariant descriptor. The second method represents the shape of a 2D drawing from the statistics perspective as a distance distribution between two random sampled points.

As a robust rotation invariant descriptor, spherical harmonics representation can be successfully applied to 3D shape matching. It arises on the sphere in the same way that the Fourier exponential function arises on the circle. According to the theory of spherical harmonics, a function $f(\theta,\phi)$ represented in a spherical coordinate can be approximated with a sum of its spherical harmonics $Y_l^m(\theta,\phi)$:

$$f(\theta, \varphi) = \sum_{l=0}^{\infty} \sum_{m=-l}^{m=l} a_{l,m} Y_l^m(\theta, \varphi) \tag{9}$$

where $\{a_{l,m}\}$ are the coefficients in the frequency domain, $Y_l^m(\theta,\phi)$ are the angular portion of the solution to Laplace's equation and defined as $$Y_l^m(\theta, \varphi) = \sqrt{\frac{2l+1}{4\pi} \frac{(l-m)!}{(l+m)!}} P_{l,m}(\cos\theta) e^{im\varphi} \tag{10}$$

where $P_{l,m}(x)$ is an associated Legendre polynomial.

If $f(\theta,\phi)$ is a spherical function with bandwidth B, then Equation (32) can be rewritten as $$f(\theta, \varphi) \approx \sum_{l=0}^{B} \sum_{m=-l}^{m=l} a_{l,m} Y_l^m(\theta, \varphi) \approx \sum_{l=0}^{B} f_l(\theta, \varphi) \tag{11}$$

where $f_1(\theta,\phi)$ can be regarded as a component of $f(\theta,\phi)$ with frequency 1. In other words, Equation (11) is an energy representation of the spherical function $f(\theta,\phi) \cdot f(\theta,\phi)$ has a valuable property: rotating a spherical function does not change its $L_2$ norm, i.e., its energy as represented by Equation (12) is a rotation invariant.

$$\|f_l(\theta, \varphi)\| = \sqrt{\sum_{m=-l}^{l} a_{l,m}^2} \tag{12}$$

Therefore, by applying spherical harmonics transform to a spherical function representing a 3D shape, we will get a set of rotation invariant descriptors for this shape. The similarity between two shapes whose spherical functions are $f$ and $g$ can be measured by Equation (13).

$$D(f, g) = \sum_{l=0}^{B} (\|f_l\| - \|g_l\|)^2 \tag{13}$$

To make use of the valuable properties of the spherical harmonics, a strategy dubbed 2.5D spherical harmonic representation can extract a series of rotation invariants by transforming a 2D drawing from 2D space into 3D space uniquely. The name "2.5D" arises from the fact that a 2D drawing is represented in a 3D space. The transformation is explained by the following steps.

Figure 14:
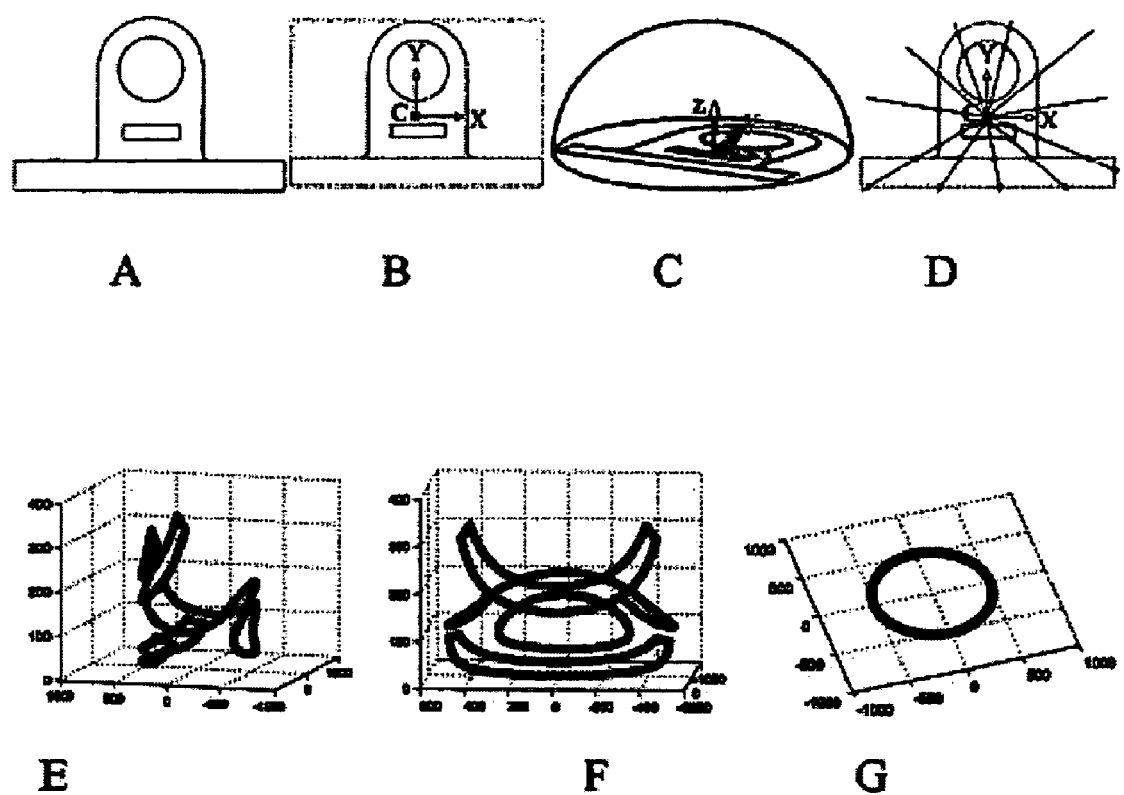
FIG. 14 shows an example of extending a two-dimensional drawing into three dimensions.

(1) Given a 2D drawing D (e.g., FIG. 14(*a*)), compute its axis-align bounding box B as FIG. 14(*b*) shows according to Equation (14).

$$B=\{\text{left}=\min(D(x)), \text{top}=\min(D(y)), \text{right}=\max(D(x)), \text{bottom}=\max(D(y))\} \tag{14}$$

where $\{D(x), D(y)\}$ represents the points composing a 2D drawing.

(2) Determine a sphere S that satisfies the following three conditions:

Its center c is in accordance with the center of bounding box B, i.e., Equation (15).

$$c = \left\{ \frac{B.\text{left} + B.\text{right}}{2}, \frac{B.\text{top} + B.\text{bottom}}{2} \right\} \tag{15}$$

Its radius r is equal to half the longer diagonal length of bounding box B. The purpose is to ensure sphere S can enclose 2D drawing D completely. As described later, the spherical radius is also used for normalization.

The 2D drawing lies in the equator plane of sphere S.

The obtained sphere is shown in FIG. 14(*c*). For the sake of simplicity, we can position this sphere into a coordinate system xyz. The sphere center locates at the origin and the equation plane lies in the xy plane.

Figure 15:
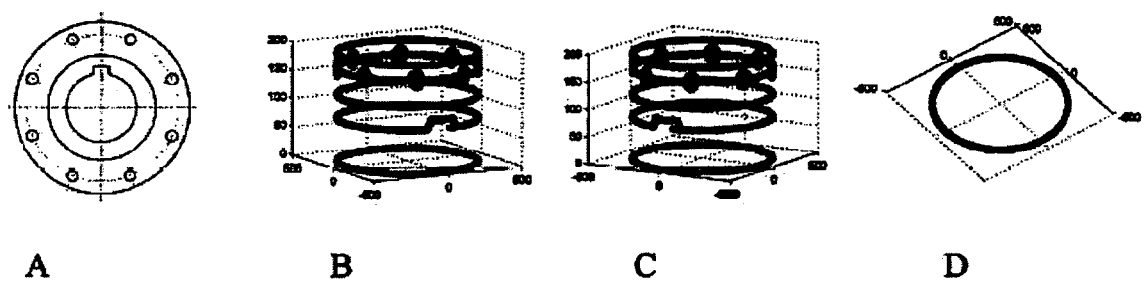
FIG. 15 shows an example of extending a two-dimensional drawing into three dimensions.

(3) Generate a set of rays uniformly, which start from the sphere center c and locate in plane xy where the 2D drawing lies, and compute the intersections between these rays and 2D drawing D. The resulting intersection point set $\{p_i\}$ can be regarded as an approximating representation of 2D drawing D., as FIG. 14(*d*) shows. Since the intersection points distribute along certain angles $\theta$ with respect to axis x, they also can be represented by $\theta$ and $d_i$, i.e., $p_i = f(\theta_i, d_i)$, where $d_i$ is the distance between point $p_i$ and the sphere center c. However, along a single $\theta_i$, there might be multiple intersection points. To make use of the valuable property of the spherical harmonics transformation, we transform all intersection points $\{p_i = f(\theta_i, d_i)\}$ into a spherical function form $\{p_i = f(\theta_i, \phi_i, d_i)\}$ by introducing a new variable $\phi_i$. To ensure each intersection point $p_i$ corresponding to a unique $(\theta_i, \phi_i)$, a simple transformation can be used as Equation (16) shows to determine $\phi_i$.

$$\varphi_i = \arctan\left(\frac{d_i}{r}\right) \tag{16}$$

where r is the radius of sphere S. For a given drawing, the r is determined uniquely, while for an intersection point $p_i$, $d_i$ is also uniquely determined. For an intersection point $p_i$, the corresponding $\phi_i$ obtained by Equation (39) is unique. Therefore, a 2D drawing is uniquely transformed into a 3D spherical representation, i.e., the correspondence between a 2D drawing and its spherical function is one to one. This process is dubbed a 2.5D transformation, and FIGS. 14(*e*)~14(*g*) show the final 3D representation of the drawing in FIG. 14(*a*) from different perspectives. In fact, the proposed 2.5D representation transforms a 2D drawing by elevating and projecting it on the surface of a cylinder. FIG. 15 shows an example about this transformation. From this example, notice that the geometric information is represented clearly in 3D space along the surface of a cylinder.

To get the rotation invariants as Equation (12) shows, a fast spherical harmonics transformation method in which a spherical function of bandwidth B is sampled on the 2B-many Chebyshev points and not the B-many Gaussian points can be used. These sampled points form a 2B×2B equiangular grid along the longitude and latitude of a sphere, i.e., the sampling nodes $\{(\theta_i, \phi_i)\}$ on this equiangular grid are $$\begin{cases} \theta_i = (i+0.5)\dfrac{\pi}{2B} \\ \varphi_i = (j+0.5)\dfrac{\pi}{B} \end{cases} i, j = 0, 1, 2, \ldots, 2B-1 \quad (18)$$

According to this sampling requirement, the ray casting process mentioned above should be conducted at a sampling rate 2B along the longitude direction. After the proposed 2.5D transformation is finished, Equation (18) can be used to decide at which Chebyshev node (i,j) a sample $(\theta_i, \phi_i)$ locates.

$$\begin{cases} i = i \\ j = \dfrac{2B\varphi_i}{\pi} - 0.5 \end{cases} i, j = 0, 1, 2, \ldots, 2B-1 \quad (18)$$

To represent the shape at Chebyshev node (i,j), a simple way is to use the distance $d_i$. Therefore, a 2D drawing D is represented by a function defined at Chebyshev nodes, i.e., a 2B×2B equiangular grid along the longitude and latitude of a sphere:

$$D = \{d_i = f(i,j) | i,j = 0,1,2,\ldots,2B-1\} \quad (19)$$

However, different drawings usually have different sizes. If two drawings with the same shape have different sizes, then their $\{d_i\}$ will be different. Therefore, before the fast spherical harmonics transformation is conducted, a normalization step is needed. A way to normalize a 2D drawing is to normalize the longer or shorter edge of its bounding box by a predefined value (e.g., V). The normalization process is expressed as $$\begin{cases} \text{scale} = \dfrac{V}{r} \\ D = \{d_i \times \text{scale} = f(i,j) | i, j = 0, 1, 2, \ldots, 2B-1\} \end{cases} \quad (20)$$

where r is the radius of the sphere mentioned above.

A fast spherical harmonics transformation can be imposed upon the spherical representation of a 2D drawing with a bandwidth B as Equation (20) shows. For each frequency, a rotation invariant descriptor will be obtained according to Equation (12) and the similarity between 2D drawings is measured according to Equation (13). This proposed method avoids one-to-multiple correspondence and the instability caused by shape perturbation, and thus obtains a set of robust rotation invariant signatures for a 2D drawing.

It is known that a small value of B can be as a low-pass-filter and may miss some details, while a larger value of B will take into account small details and need more computational resources. To determine a better balance point, use the inverse spherical harmonics transformation to check the precision under different bandwidths. Simple computation shows that when B is equal to 64, the precision is almost $5\times10^{-3}$. The precision is enough for the purposes of 2D drawing retrieval.

In another method to measure the similarity between 3D shapes, a 3D shape has been represented as a signature named shape distribution that is formed by random points sampled uniformly from the shape surface. In this embodiment, a 2D shape distribution analog is derived. Experiments show this derivation is good at computing the similarity between 2D drawings, and it also allows users to emphasize local shapes by adjusting sampling strategy. This derived 2D shape distribution method will be described in detail as follows.

A 2D drawing is usually composed of some basic geometric entities, such as lines, circles, and arcs. For later sampling purposes, a discretization process is adopted to transform all entities contained in a drawing into a set of line segments. In this way, a 2D drawing S can be represented as $$S = \{((x_i, y_i),(x_{i+1}, y_{i+1})) | 0 \le i \le n-1\} \quad (21)$$

where n is the total number of the line segments included in stroke S, $(x_i, y_i)$ and $(x_{i+1}, y_{i+1})$ are the two ending points of a line segment. Particularly, for a scanned drawing, it can be represented directly by a set of points, and the later sampling process can be replaced with an edge-enhancing procedure (e.g., Canny edge detector).

To ensure that the sampling process is conducted efficiently and uniformly, a look-up table-based algorithm has been designed.

A first step is to compute the summed length of all line segments included in stroke S. When each line segment is added, the summed length is saved into table T with size n, where n is the total number of the line segments. Table T can be represented by a linear array as Equation (22) shows.

$$T = \left\{ t_i \mid t_i = \sum_{j=0}^{i} L((x_j, y_j), (x_{j+1}, y_{j+1})), 0 \le i \le n-1 \right\} \quad (22)$$

where L is the Euclidean distance between two points.

A second step is to generate a random real number r between 0 and the total length $t_{n-1}$, and then use the well-known binary-search algorithm to find out the position m where r locates in the table. This found position corresponds to line segment $((x_m, y_m),(x_{m+1}, y_{m+1}))$. A third step is to generate a random real number l between 0 and 1. According to Equation (23), we can get a sample point $(x_k, y_k)$ and save it into an array A.

$$\begin{cases} x_k = x_m + l \times (x_{m+1} - x_m) \\ y_k = y_m + l \times (y_{m+1} - y_m) \end{cases} \quad (23)$$

Repeating the above second and third steps for 2×N times, we can get N point pairs that are sampled in an unbiased manner.

Figure 16:
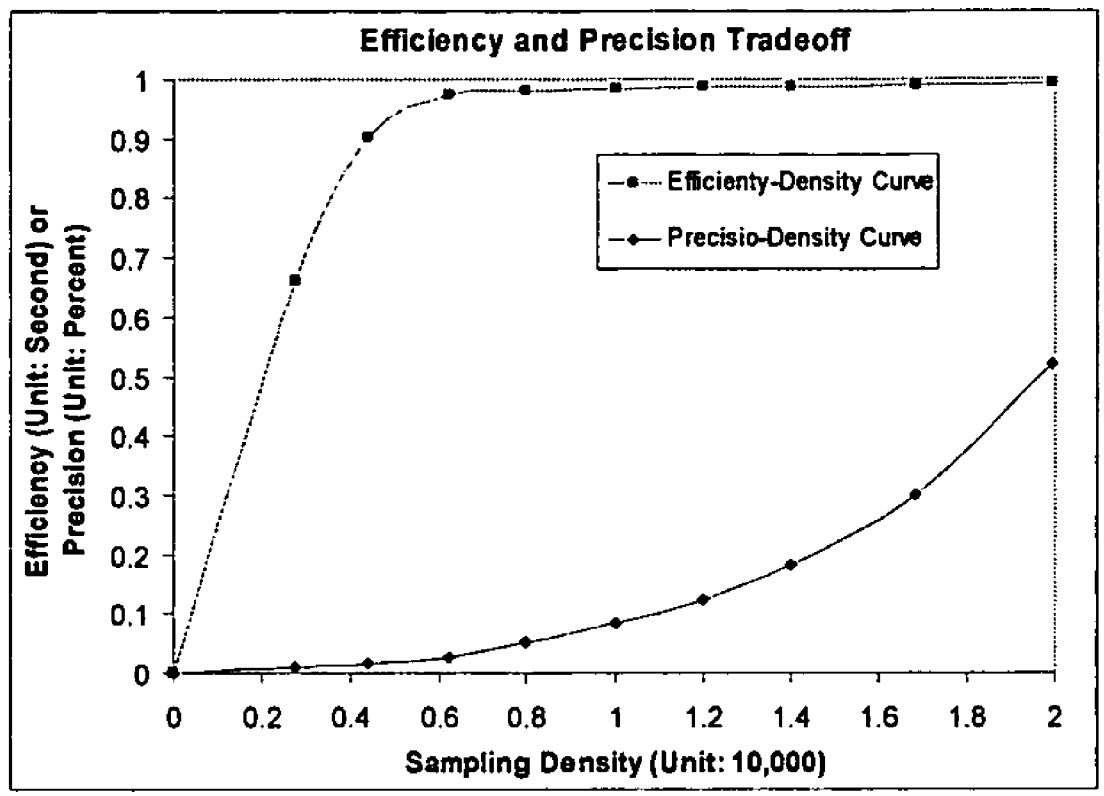
FIG. 16 shows a plot of efficiency and performance tradeoff.

In the sampling procedure, we have to consider two problems: sampling density and sampling method. From the perspective of statistics, more samples will approximate the original shape more precisely and also need more computing resources (e.g., memory and time). Thus, there is a tradeoff between efficiency and precision. FIG. 16 shows experimental results considering this tradeoff. The horizontal axis represents the sampling density, while the vertical axis represents the time cost of sampling procedure or the differences under different sampling densities. It can be concluded from the curves that for a 2D drawing, $10^5$ sampling point pairs are enough to achieve a better balance between precision and efficiency.

Once enough random point pairs are sampled, the next step is to build the corresponding distance histogram which is described by a shape function. In our 2D drawing retrieval system, we adopt D2, i.e., the Euclidean distance between two points, as the shape function. Since 2D drawings usually have different geometric sizes, a normalization process is needed to account for this difference. A distance histogram can be built and normalized in this way.

First, define a division number h for the distance histogram, i.e., a distance histogram H consists of h parts with uniform distance.

Second, determine a standard value N used for normalization. Generally, there are two simple ways to find such a value as Equation (24) shows. The first one uses the maximum distance among all sampled point pairs as the standard value. The second one uses the average distance of all sample point pairs as the standard value.

$$N = \begin{cases} MAX\{D2((x_i, y_i), (x_{i+1}, y_{i+1}))\} \\ \quad\quad\quad\text{or}\quad\quad\quad 0 \leq i \leq n-1 \\ \dfrac{\sum_{i=0}^{n-1} D2((x_i, y_i), (x_{i+1}, y_{i+1}))}{n} \end{cases} \quad (24)$$

Third, calculate the distances of all sample point pairs and count how many sample pairs fall into each part of distance histogram H(i), where $0 \leq i \leq h$. By traversing each point pair $(x_i, y_i), (x_{i+1}, y_{i+1})$ in array A, the resulting histogram H can be built by Equation (25).

$$H(i) += 1, i = \dfrac{D2((x_i, y_i), (x_{i+1}, y_{i+1}))}{N}, 0 \leq i \leq 2n-1 \quad (25)$$

Figure 17:
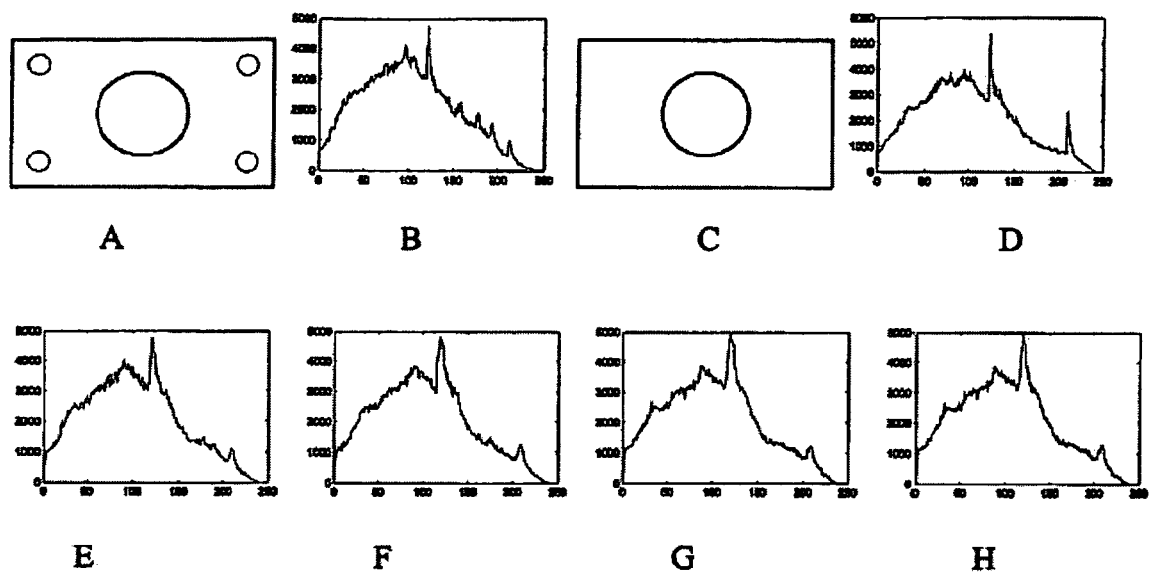
FIG. 17 shows an example of a biased sampling of an example embodiment.
Figure 32:
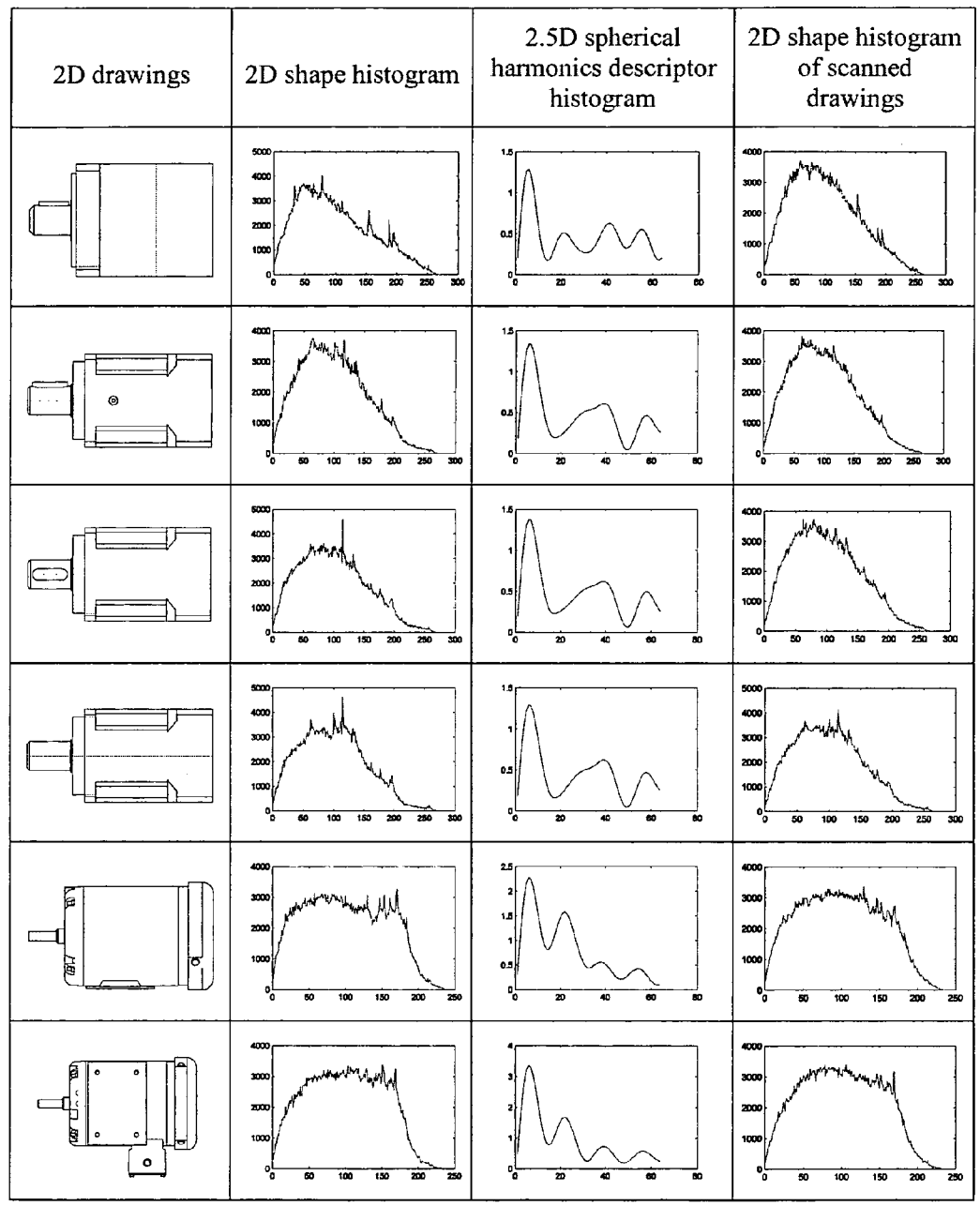
FIG. 32 shows example descriptor results.

Some shape histogram examples of 2D drawings are shown in FIG. 17 and FIG. 32.

The shape histogram generated by a uniform sampling strategy reflects the global geometric properties of a 2D drawing. In practice, users frequently would like to emphasize local shapes for retrieval purpose. To support such retrieval attention, a biased sampling strategy has also been implemented: users are allowed to specify a higher sampling rate on their desired local shape to emphasize the desired local shape. For example, two similar drawings and their shape histograms are shown in FIG. 17(a)~17(d) respectively. For the drawing in FIG. 17(a), if users want to emphasize the local shape composed by the rectangle and the big middle circle, they can super sample them interactively. When the super sampling rate of the local shape composed of the rectangle and the big middle circle changes from 200% to 500%, the corresponding histogram becomes more similar to the histogram of the shape shown in (b).

In our prototype system, Minkovski distance $L_n$ is used because of its simplicity. Therefore, for two histograms, i.e., $H_1$ and $H_2$, the similarity W is $$W(H_1, H_2) = L_n(H_1, H_2) = \sqrt[n]{\sum_{i=0}^{h} (H_i(i) - H_2(i))^{1/n}} \quad (26)$$

where h is the dividing number of a histogram.

For 2D drawings, Equation (26) can be used to compute their similarity directly. Since a 3D model is represented by three orthogonal drawing-like views, a procedure is needed to find the correspondence between drawing-like views from different models. To simplify this process, the minimum values between all possible view-pairs can be used to represent their similarity:

$$W(M_1, M_2) = \sum_{k=0}^{2} MIN\{W(m_{1i}, m_{2j}) \mid 0 \leq i \leq 2, 0 \leq j \leq 2\} \quad (27)$$

Where $m_{1i}$ represents view i of model $M_1$, $m_{2j}$ represents view j of model $M_2$, $(m_{1i}, m_{2j})$ represents a view-pair between 3D models. It is worth pointing out that a view-pair can not be computed twice.

Figure 18:
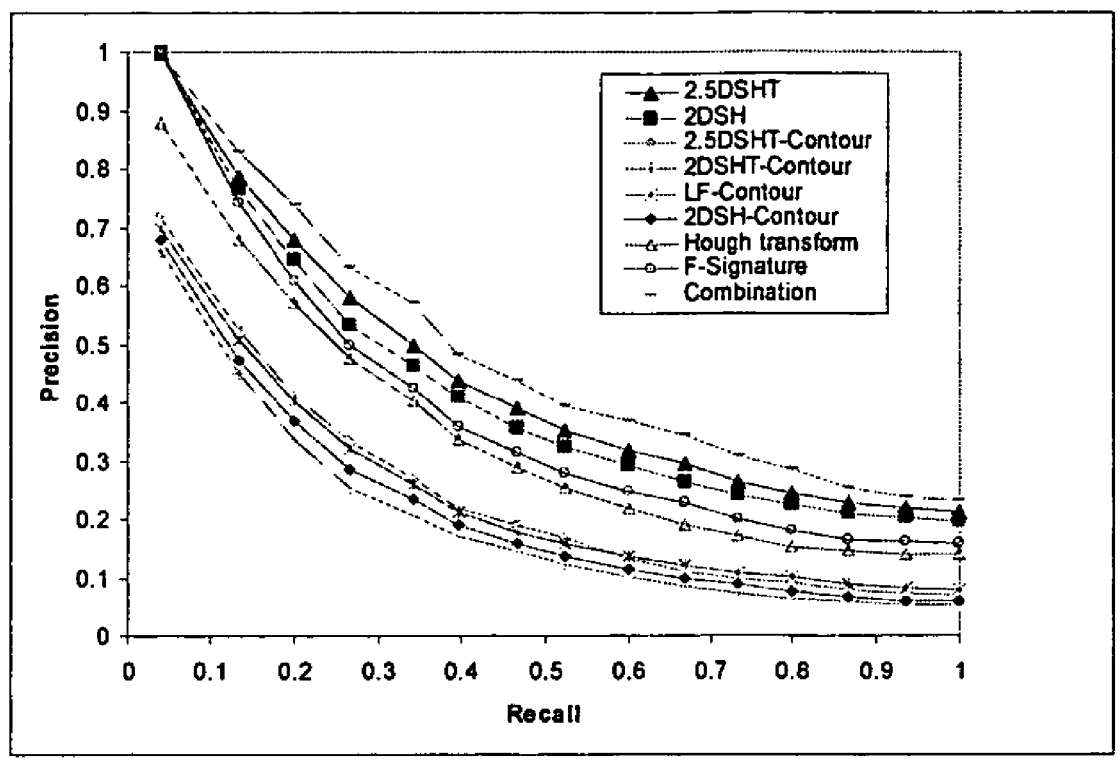
FIG. 18 shows the results of a retrieval discrimination evaluation.

Given the approaches described, it is possible to combine them to achieve better performance. To make sure that two different approaches can be applied to the whole 2D drawing space, a weight value to each method can be used along with using their combined confidence to measure their similarity. Given a 2D drawing, its similarity confidence T using the two approaches described can be represented as $$T = w_s C_s + w_d C_d \quad (28)$$

where $C_s$ is the similarity obtained by 2.5D spherical harmonics method, $C_d$ is the similarity obtained by 2D distance histogram method, and $w_s$ and $w_d$ are the weight values of the respective methods. Higher weight value means that the corresponding method plays a more important role in differentiating a 2D drawing. In FIG. 18, the "Combination" represents the combination of our two proposed methods using equal weights, i.e. (0.5, 0.5). From this precision-recall curve, it can be seen that this combined approach has the best performance.

Figure 19:
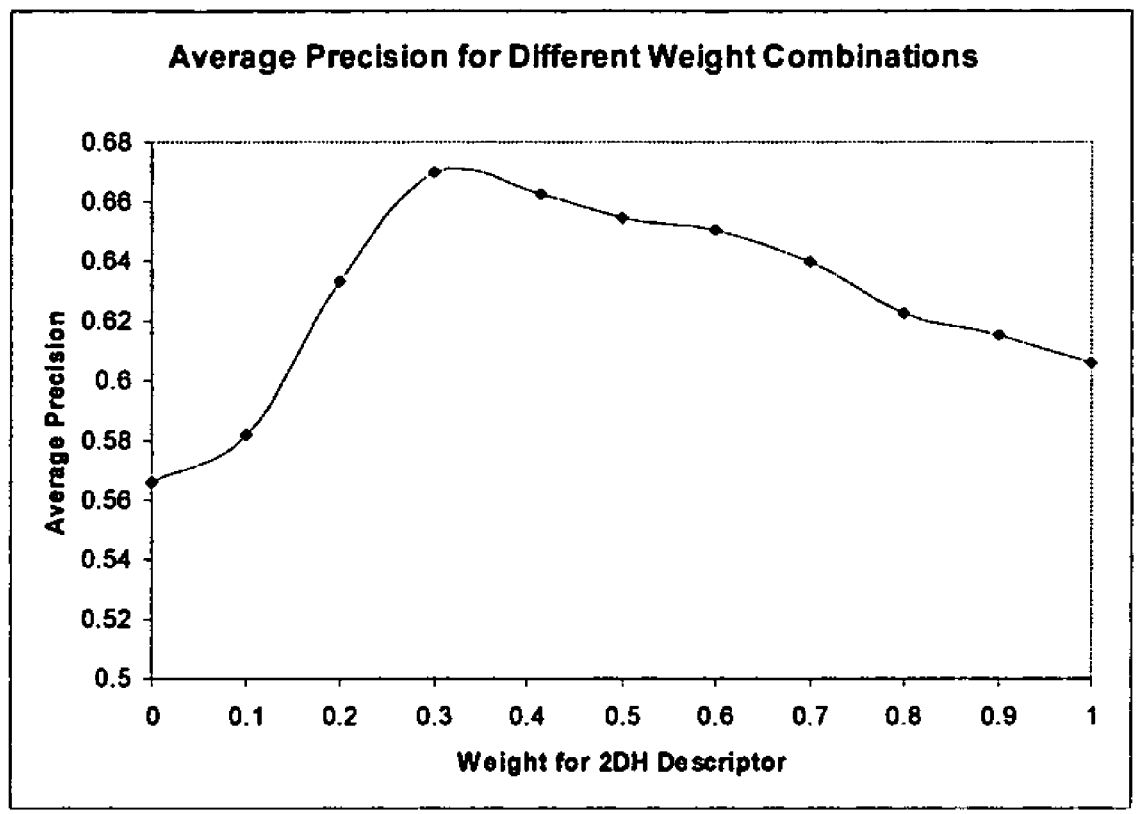
FIG. 19 shows the average precision-recall curves for different methods.

To determine the best combination of weights for the two proposed methods, a test was performed. Since there is a single independent weight $w_s(w_d=1-w_s)$, the weight was changed from 0 to 1 in increments of 0.1. From the experiments it was observed that increasing the weight $w_s$ of the 2D distance histogram method (2DSH) improved the average performance for the entire database, however there was a marked improvement in performance when increasing the weight beyond 0.3, yielding the best performance at weights (0.3, 0.7), i.e. the weight of the 2D distance histogram method is 0.3, while the weight of the 2.5D spherical harmonics method (2.5DSHT) is 0.7. FIG. 19 illustrates this trend curve for different weight combinations. The horizontal axis represents the weight changes of the 2D distance histogram method. The default weights in our system can be set to (0.3, 0.7) while allowing the user to change the weights for different queries.

The above mentioned 2D descriptors can be used on any 2D drawing, projection, sketch, etc. to create a database of 2D descriptors associated with drawings or models and are capable of being searched.

User Interface

Figure 20:
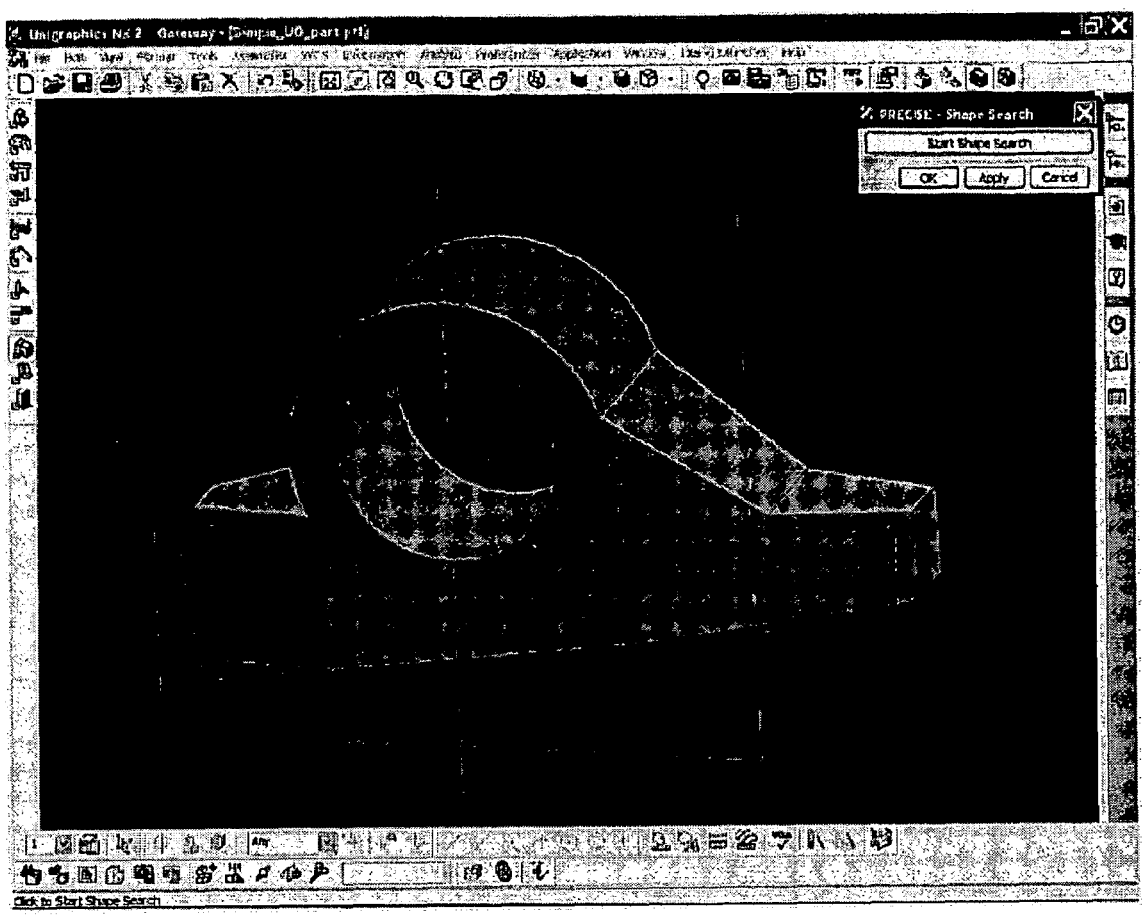
FIG. 20 shows a diagram of an example model.
Figure 21:
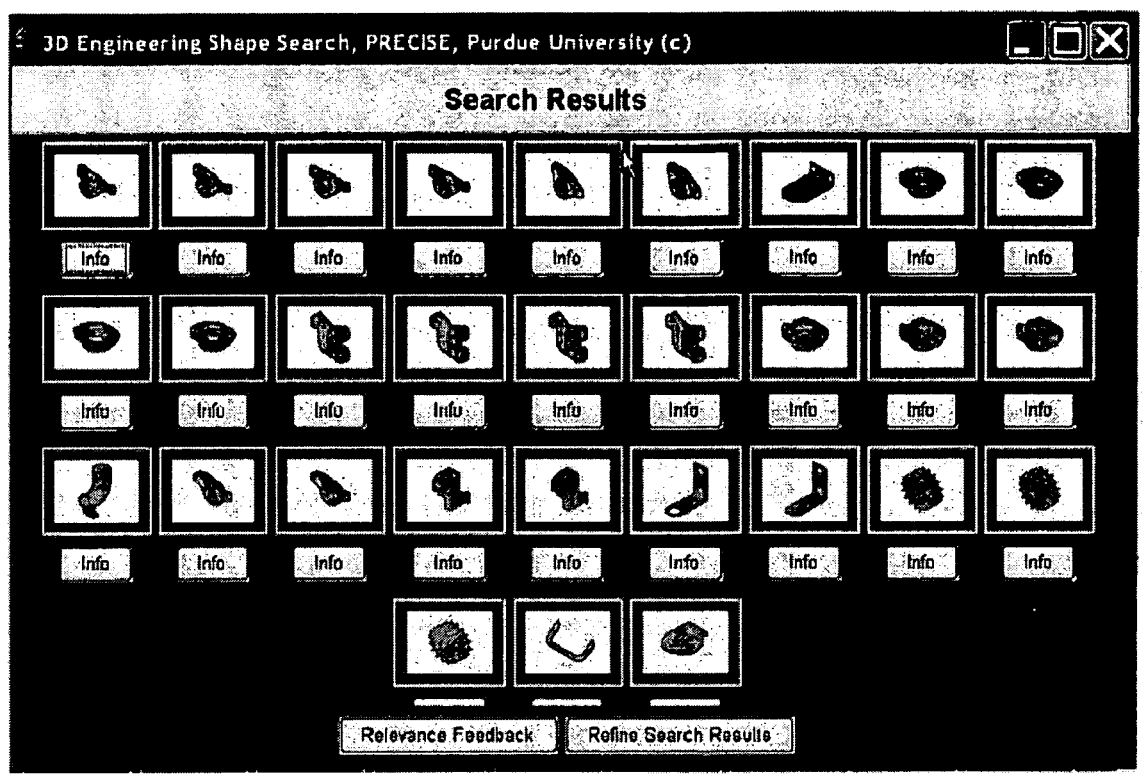
FIG. 21 shows a listing of example search results.
Figure 22:
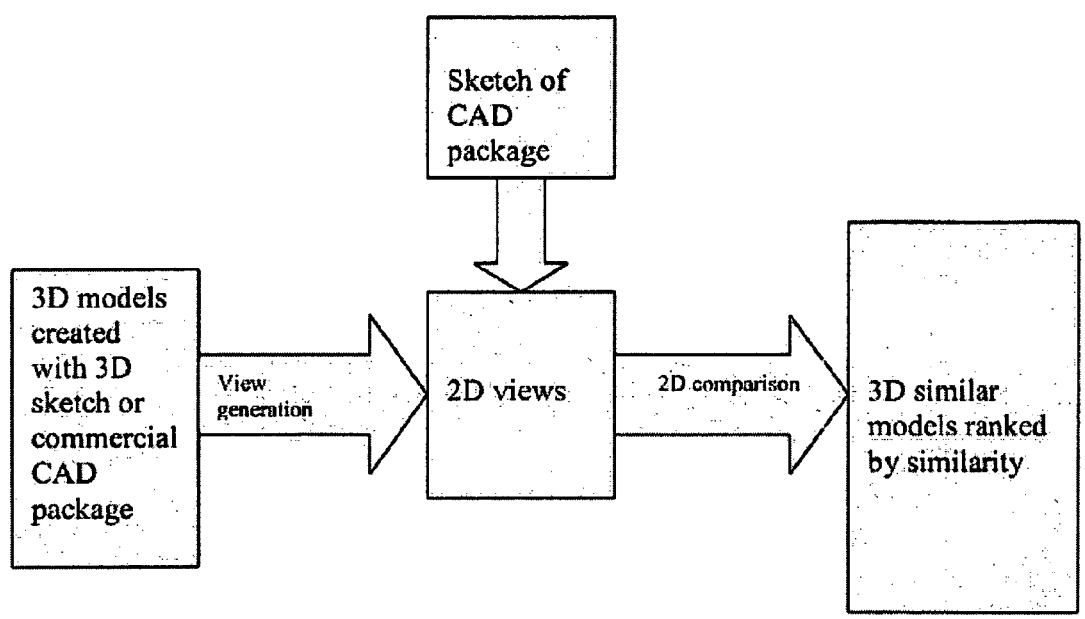
FIG. 22 shows an embodiment of a model analysis and comparison method.

Many applications for this disclosure will be recognized. One example is for searching using CAD sketch and 3D models. The CAD sketch is quickly mapped to the data structure presented above and can be utilized as the input to search 3D models. When a user opens a model in a CAD system, the search system can quickly generate 2D views using the underlying technology or even using the drafting functionality of CAD system. As long as the model is represented as 2D views, they can be used to search as the sketch created in our free-form sketch interface. FIG. 20 and FIG. 21 illustrate the integration of our search system with Unigraphics. FIG. 22 illustrates the pipeline of taking 3D models as input, convert into 2D views, and then use 2D algorithms to search similar 3D shapes. This is an approach from 3D to 2D and back to 3D.

Figure 23:
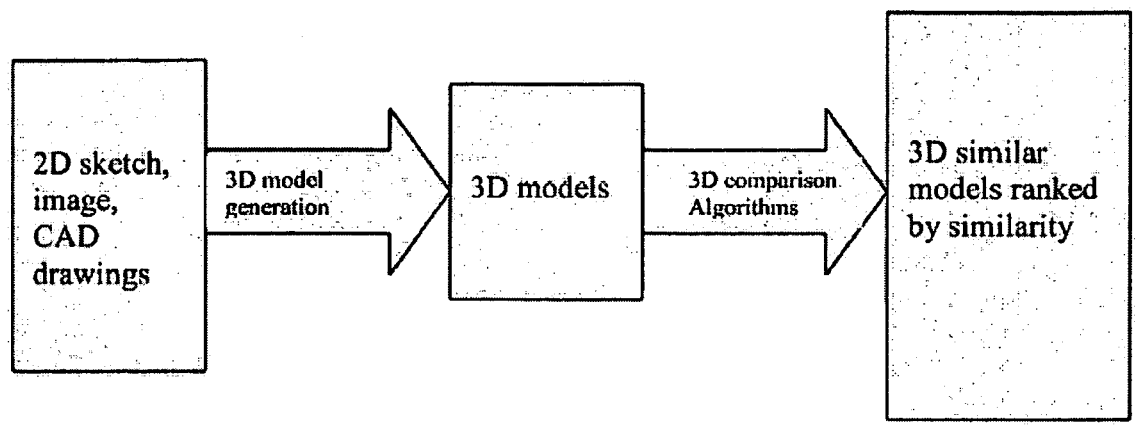
FIG. 23 shows an embodiment of a model generation and comparison method.

Another example is for converting 2D sketches and/or 2D drawings and using 3D shape search technology. The underlining technology can take 2D sketches, images, and/or drawings and convert them to 3D models. The 3D models can be compared and searched, for example by using the disclosure above. FIG. 23 illustrates the pipeline that takes 2D input, converts it into 3D models, and uses a 3D comparison and search algorithm.

It is noted, that the search system presented herein is very easily integrated with any CAD systems. A user can use either the sketch or 3D models created by the CAD system to query a database. In this case, the 3D models are quickly converted into 2D views using the methods and techniques described above.

Figure 24:
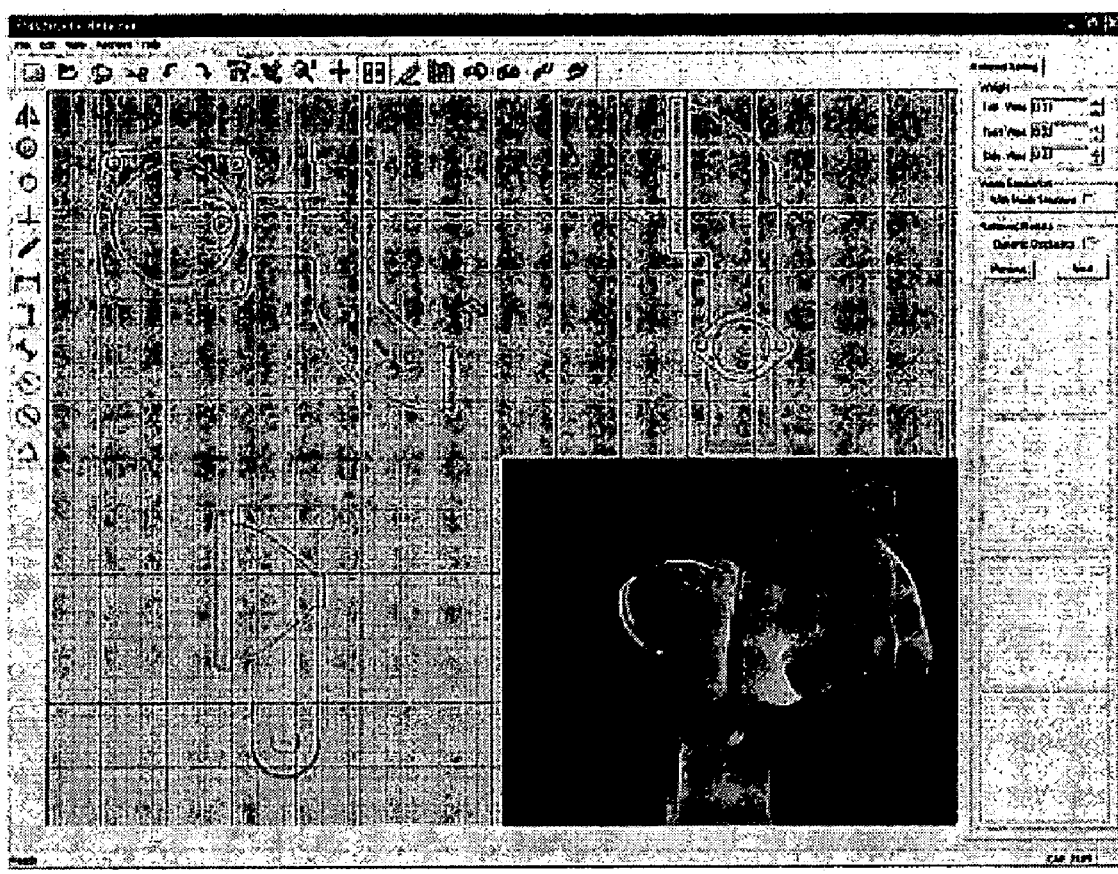
FIG. 24 shows an example user interface with an example model and example drawings.

One application for this proposed method is sketch based user interface, in which the query process is similar to what engineers use to represent 3D shapes on a piece of paper. FIG. 24 shows the user interface of our prototype system in which users can express their concept freely. Their emphasis on some views can be realized by adjusting the weights.

The sketch based user interface allows users to express their attention freely. People tend to sketch objects with fragmented boundary contours and few other lines that are not very geometrically accurate. The most frequently chosen views are not characteristic views, but instead ones that are simpler to draw (front, side, and top views). Users can also specify weights to emphasize certain views of the shape. In this way, the similarity expressed in Equation (8) can be modified as $$\text{Similarity} = \sum_{i=0}^{n} w_i (s_i - k_i)^2 \qquad \sum_{i=0}^{n} w_i = 1 \qquad (29)$$

where $w_i$ is the weight of view i, the other parameters are the same as Equation (5). If one view has higher weight, then the shape that it describes will play a more important role to determine the similarity degree between two models.

The retrieval process is robust for snatch hand-drawn input. The similarity measurement is based on a statistical method, in which a large amount of points will be sampled on the edges of input images. This process is insensitive to noises. Therefore, irregular or snatch input will not influence the retrieval performance greatly.

One can also search with a rough sketch and refine with drawing. Usually, it is not feasible for users to draw the desired shape in detail, and users would like to hand draw just a few sketches to retrieve the desired models. To do this, we provide a kind of feedback mechanism for users. There are several ways that users can provide their feedback.

Figure 25:
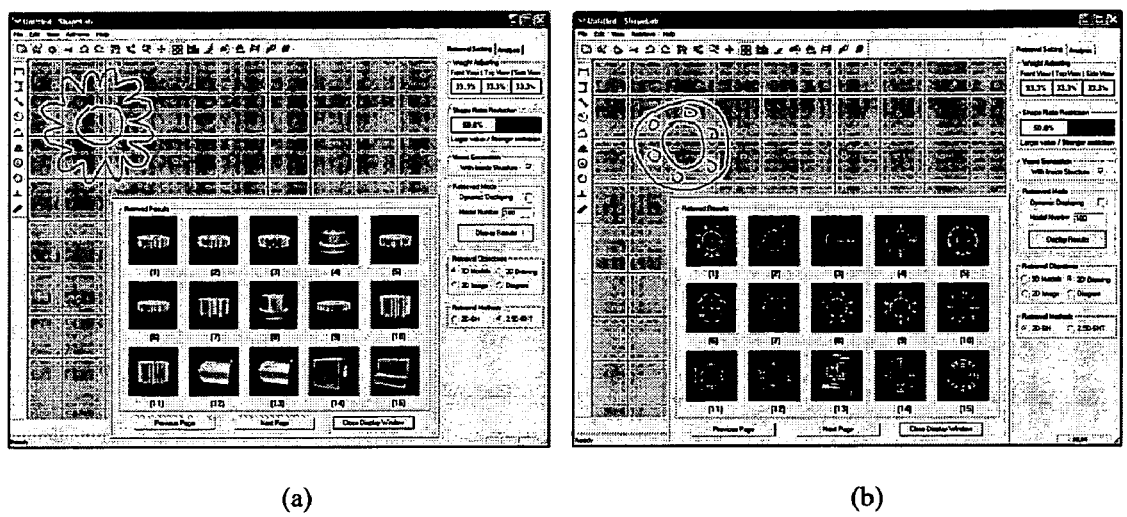
FIG. 25 shows embodiments of an example user interface with sketches and retrieved results.

FIG. 25 shows the framework of our implemented sketch user interface and its visual appearance: (a) is a 3D model retrieval example using freehand sketches; and (b) is a 2D drawing retrieval example using freehand sketches. In fact, users are also allowed to retrieve 2D drawings or 3D models using a 2D drawing or a 3D model.

Figure 26:
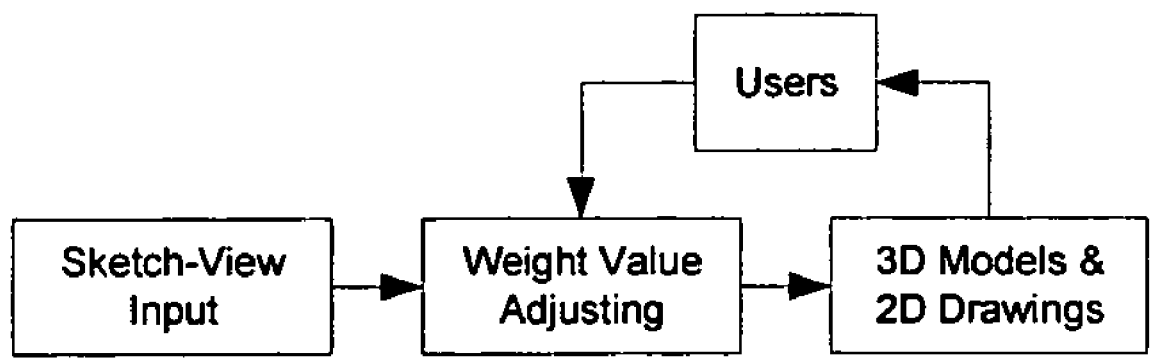
FIG. 26 is a flowchart showing an embodiment of a user-feedback method.

One system provides several feedback ways for users to interactively refine retrieval results. One method is to provide weight value adjustment for orthogonal views. A 3D model may be described by three orthogonal views. Different views reflect certain shape characteristics from different perspectives. To find similar shapes with certain features, users are allowed to emphasize certain views by adjusting their weights as indicated above. This interaction is illustrated by FIG. 26. In this process, after some coarse results are retrieved, users can refine the results by assigning a higher weight to the views that play a more important role in the desired shape. The larger the weight value is, the more important the view will be. Users can repeat this process to refine the searched results.

Figure 27:
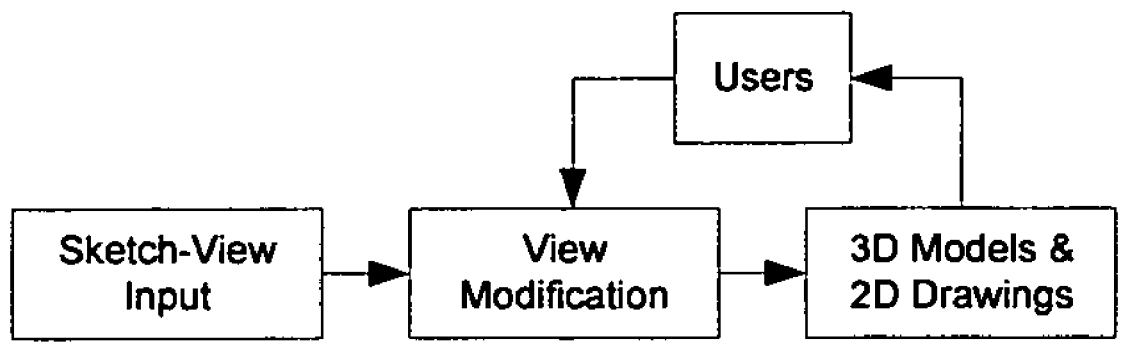
FIG. 27 is a flowchart showing an embodiment of a user-feedback method.

Another method provides for initial sketch input editing. In some cases, just adjusting weight value is not enough because the initial sketch is not sufficient to represent the desired models and sometimes users make mistakes. Enabling a user to edit the initial sketch input is an efficient way to refine the search results, especially when the searched results can be displayed dynamically along the modification of the sketch. This interaction can be illustrated in FIG. 27. Users can modify the input sketches according to the retrieved results.

Figure 28:
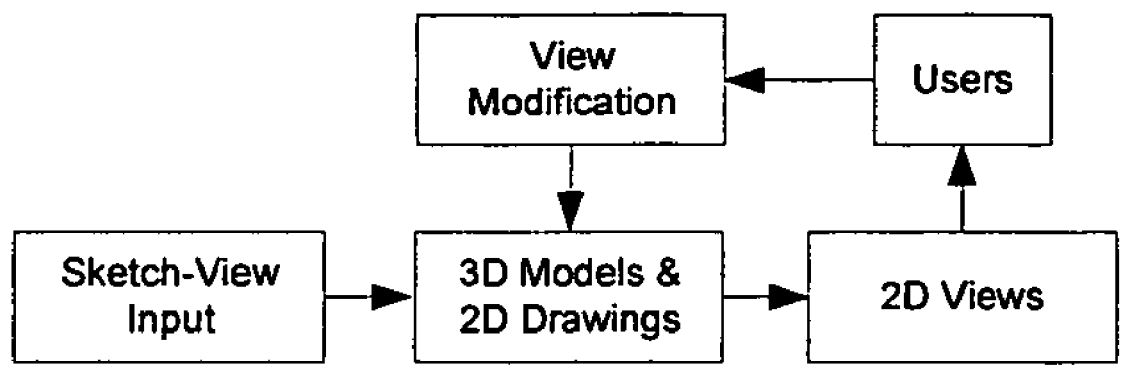
FIG. 28 is a flowchart showing an embodiment of a user-feedback method.

Yet another method provides for interacting with the retrieved results. In the two interactions described previously, retrieved results are used to help users to check and modify the improper input. A third approach can also be used to edit the views of the retrieved 3D models or 2D drawings to improve and refine the retrieval results. As described above, the 2D views of a 3D model can be generated automatically. Therefore, users can input a simple coarse sketch first and find similar 3D models as another round sketch input. Based on the generated views, users can edit it according to their shape concepts. Because the generated views are more regular than the hand-drawn ones, this kind of feedback interaction is expected to achieve better performance. The feedback process can be illustrated by FIG. 28. In contrast with the previous feedback mechanism, this feedback mechanism allows uses to edit the views of the retrieved models.

In yet another method, users can provide an initial input and examine the results of the search. A user then can either refine the results given using the techniques described for example, or can provide yet additional input to change the nature of the search. For example a user could jump to another shape after examining the initial search results or one could input a new or changed parameter to obtain a subset of the set of results more closely meeting the user's needs and/or arranged in a hierarchy according to the user's needs. As used herein, the term "parameter" can include, among other data or information, a 2D or 3D representation of all or part of an object. A user could also provide another sketch input for the system to search or cross-reference among prior search results. A user could also provide additional details to the initial sketch, or erase existing features, and conduct the search anew or obtain a subset of the set of results more closely meeting the user's needs and/or arranged in a hierarchy according to the user's needs. For example, the user could add an aperture or erase a line and conduct the search again. Other methods of changing the direction and character of the search are contemplated.

Figure 29:
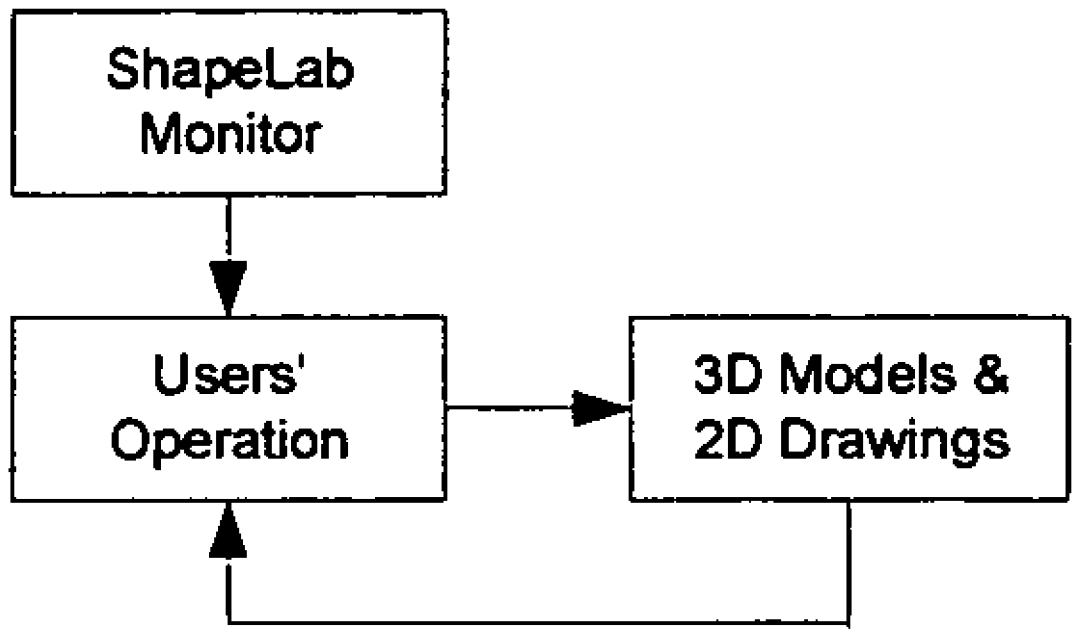
FIG. 29 is a flowchart showing an embodiment of a user-feedback method.

With the above feedback mechanisms, users can retrieve 2D drawings or 3D models in a coarse-to-fine way. Generally, it is not easy for users to find proper weight values or modify the sketches just within one time. Users may have to repeat this process several times. To accelerate this process, a dynamic retrieval mechanism is provided, as FIG. 29 shows. A user's behaviors are monitored by the system all the time. During the feedback-based interactions, once an operation is finished, the retrieval results will be dynamically refreshed so that a user can experience the impact of his operation upon the retrieval results. In this way, users can get instant feedback and adjust their operations efficiently.

The shape can be represented at global and local level. The global representation is the extracted based on the overall information without considering the features of the sketch or view. At the local level, features are extracted using feature recognition methods and representations are generated based on the relationship of different features. The following figures show the shape distribution of the overall view and those of features identified from the view.

In order to improve the search efficiency, the local features and models are indexed. The index is built on top of the commercial database, such as Oracle, SQL server, and Sybase. The search algorithm uses overall representation first and then uses local features to improve the search results. Different feature vectors are extracted and stored in the database. Therefore, after the search results with one feature vector, a user can refine the search results with other feature vector. In other words, using multi-step search methods improve the effectiveness of the search.

In the area of searching, it is also possible to build a searchable database of 3D models and 2D drawings that includes not only the shape descriptors described, but also other characteristics of the models or drawings, such as size, shape, weight, or any other types of performance characteristics like horsepower. In operation, when a user provides input to the system as described above and the system returns results of the search, the system may also return the other characteristics of the models or drawings. It is possible to further refine the results by combining the techniques described above with further refinements of the associated characteristics such as size, weight, etc.

In one embodiment, a library is built to contain an arbitrary number of 3D models or 2D drawings. The library can contain a mixture of models and drawings as well as other information. For example, the shape descriptor operators mentioned above can be used to generate a descriptor to uniquely identify each of the models or drawings; these descriptors can then be associated with the particular models or drawings that the descriptors were derived from. A user provides input to the system which can be in the form of a model, drawing or sketch input at which point the system determines a unique descriptor for the input as described above. As will be understood, the term "unique descriptor" or "descriptor"0 can refer to a single value, or a set of values, that are associated with a given drawing, model, or input. After determining the unique descriptor of the user input, the system can then search the library for a model or drawing descriptor that approximates the input using the methods described above. The system then returns a candidate model or drawing, or a set of candidate models or drawings, that are similar to the descriptor of the user input. The system can further provide methods described above that provide interactivity to assist the user in further refining the search results.

It is also possible to implement the above methods wholly in software, or a combination of software and hardware.

Experiments and Discussion

The two methods introduced in the preceding sections have been incorporated into a 2D & 3D shape retrieval system called ShapeLab. In order to test the performance of the two methods, we have built a benchmark which includes 2,000 2D drawings from industrial fields. These drawings are classified into 50 clusters from simple to complex according to their functions and geometric shape. Following, we will introduce our implemented retrieval system, i.e., ShapeLab, and present some experimental evaluation results. At the same time, a comparison between the two proposed methods is given.

Figure 30:
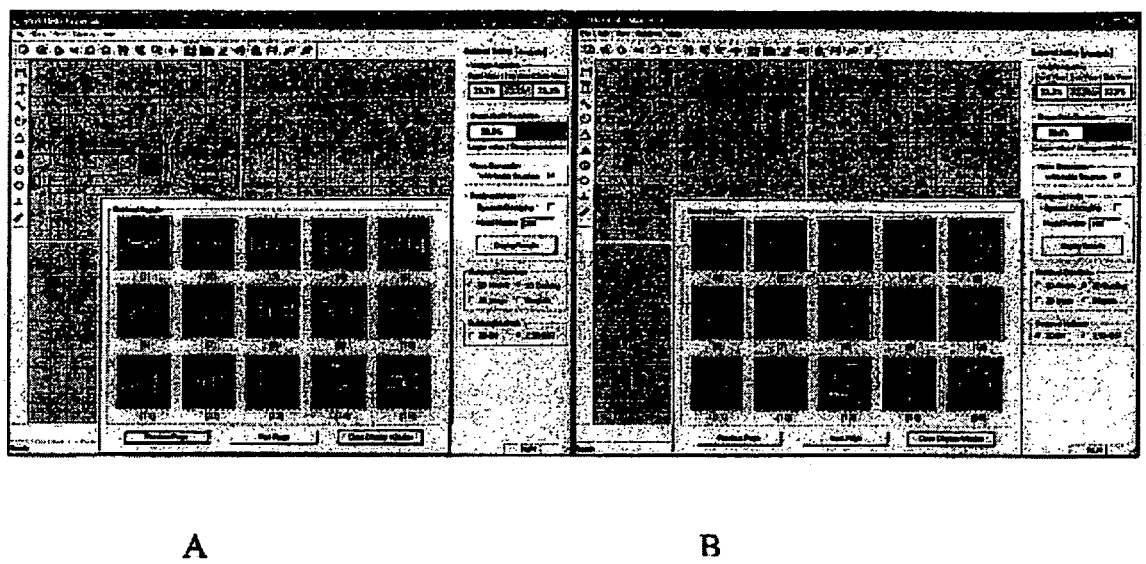
FIG. 30 shows an embodiment of a drawing retrieval system.
Figure 31:
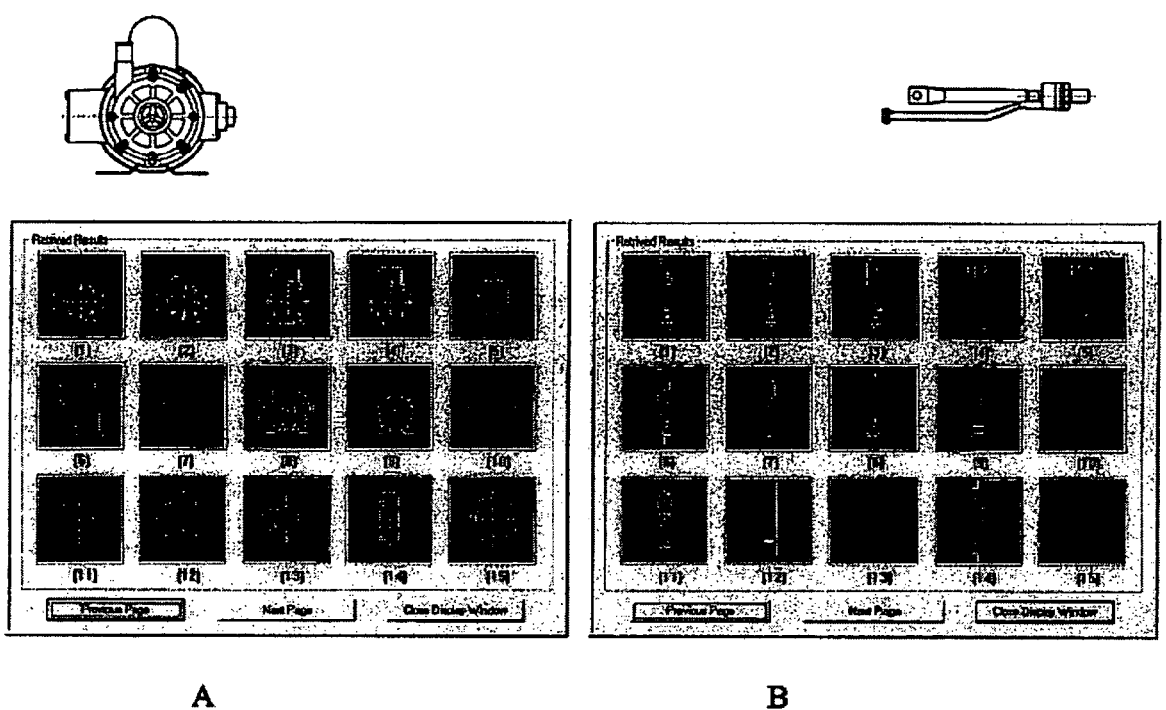
FIG. 31 shows example retrieval results.

As the experiments above demonstrate, the two methods proposed herein are robust enough to compute the similarity between sketches and are non-sensitive to scratchy input. Therefore, a sketch-based user interface supporting 2D drawing retrieval is implemented. The retrieval process is similar to the process in which engineers express their shape concept on a piece of paper. FIG. 30 shows the framework of our implemented sketch user interface and its visual appearance: (a) is a retrieval example based on a drawing query; and (b) is a retrieval example based on a freehand sketches query. In this system, a feedback mechanism is implemented to support a coarse-to-fine retrieval process. Once some drawings are retrieved, users can begin a new round refinement by selecting a retrieved drawing and modifying it. Since the retrieved drawings are more regular and precise than the hand-drawn sketches, this kind of feedback interaction can help users to find the desired drawings interactively and efficiently. FIG. 31 shows two retrieval examples using the two proposed methods respectively.

The robustness of the proposed methods is tested by analyzing the similarities among similar drawings with certain differences. FIG. 32 shows several similar drawings and their descriptor histograms, and these drawings are listed from top to bottom according to their similarity. In FIG. 32, the fourth column shows the 2D shape histograms of the corresponding drawings in the first column. For a scanned drawing, an edge enhancement procedure is conducted to detect the edges included in a drawing image. During the scanning process, noises are introduced unavoidably. From the histograms in FIG. 32, we can notice some phenomena: (1) as the first four drawings show, for similar drawings, their descriptor histograms are similar, i.e., small shape perturbations do not lead to great difference between similar drawings; (2) As the six drawings show, when the difference between drawings is increased, the difference between their histograms is also increased respectively; and (3) as the histograms of the scanned drawings show, the information missing due to digitization or noise has no readily apparent impact on the final descriptor histograms. From these examples, it can be concluded that the proposed methods are both robust against noise and small changes in local shapes. In addition, because they can be applied both to vector drawing and scanned drawing, they also have a good generality.

Figure 33:
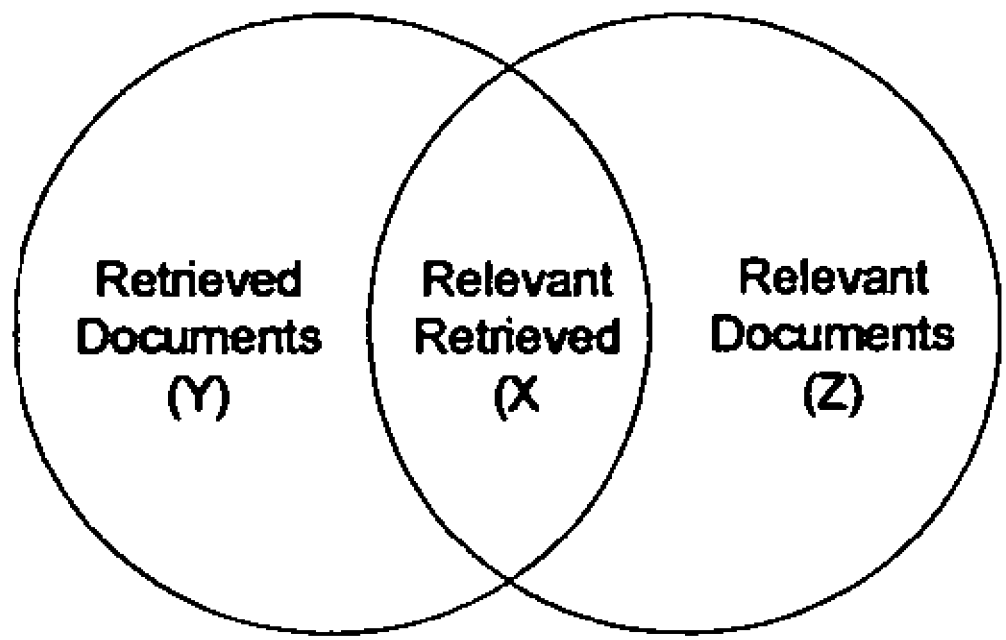
FIG. 33 shows the concepts of precision and recall.

The Precision-Recall curve is the most common way to evaluate the performance of a retrieval system. Recall measures the ability of a system to retrieve the desired objects, while precision measures the ability of a system to weed out what users do not want. Definitions of precision and recall are illustrated in FIG. 33. To compare the performance between the methods presented herein and other methods, the methods proposed by Chen et al. and Funkhouser et al. are implemented even though the two methods are used to compute the similarity of the silhouettes between two 3D shapes. In addition, to demonstrate the difference between contour-based shape matching and drawing-based shape matching for 2D drawing retrieval, the methods presented herein are also used to extract the descriptor of the contour information of a 2D drawing for retrieval purposes.

Figure 34:
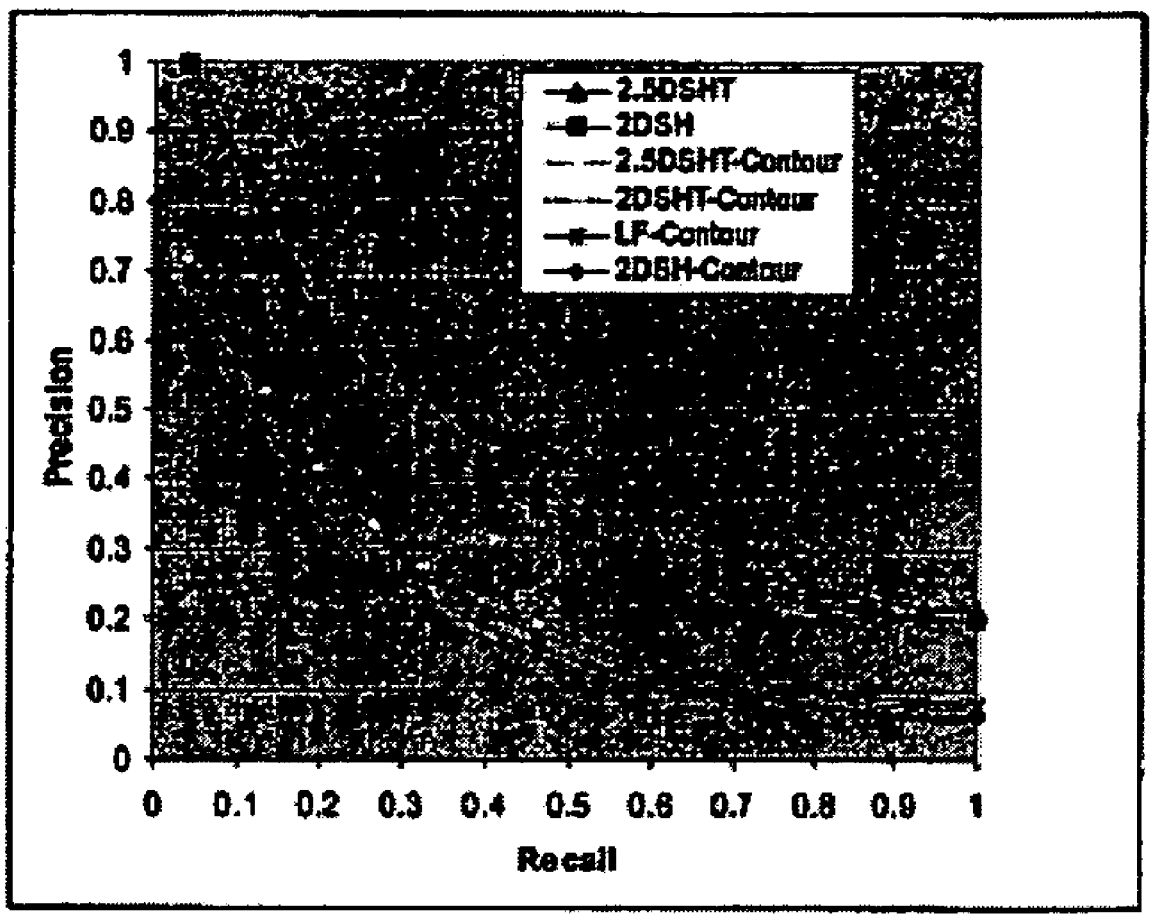
FIG. 34 illustrates a retrieval discrimination evaluation.

FIG. 34 shows the precise-recall curves of these mentioned methods, in which "2DSH" represents the 2D shape histogram method, "2.5DSHT" represents the 2.5D spherical harmonics transformation method, "2DSH-Contour" represents the performance of "2DSH" when only the contour of a 2D drawing is considered, "2.5DSHT" represents the performance of "2.5DSHT-Contour" when only the contour of a 2D drawing is considered, "LF-Contour" represents the performance of the light-filed method proposed by Chen et al. when it is used to retrieve a 2D drawing, and "2DSHT-Contour" represents the performance of the 2D analog of the spherical harmonics proposed by Funkhouser et al. when it is used to retrieve a 2D drawing.

From this precise-recall curve, it is readily apparent that the four contour-based retrieval methods have the lowest performance. Therefore, it is safe to conclude that the contour is not a good way to describe the shape of a 2D drawing. Two of the proposed methods have almost the same performance on the whole best performance among these methods ("A retrieval framework). In strict sense, the 2.5D spherical harmonics transformation method is better than 2D shape histogram method. In practice, the 2.5D spherical harmonics transformation method has been found to be good at differentiating drawings with readily apparent structure shape, such as the retrieval example shown in FIG. 31(b) while the 2D shape histogram method is good at differentiating 2D drawings with similar contour but different inside structure, such as the retrieval example shown in FIG. 31(a). Therefore, in practice, the two methods are provided together so that higher retrieval accuracy is achieved by allowing users to switch between the two methods interactively.

Figure 35:
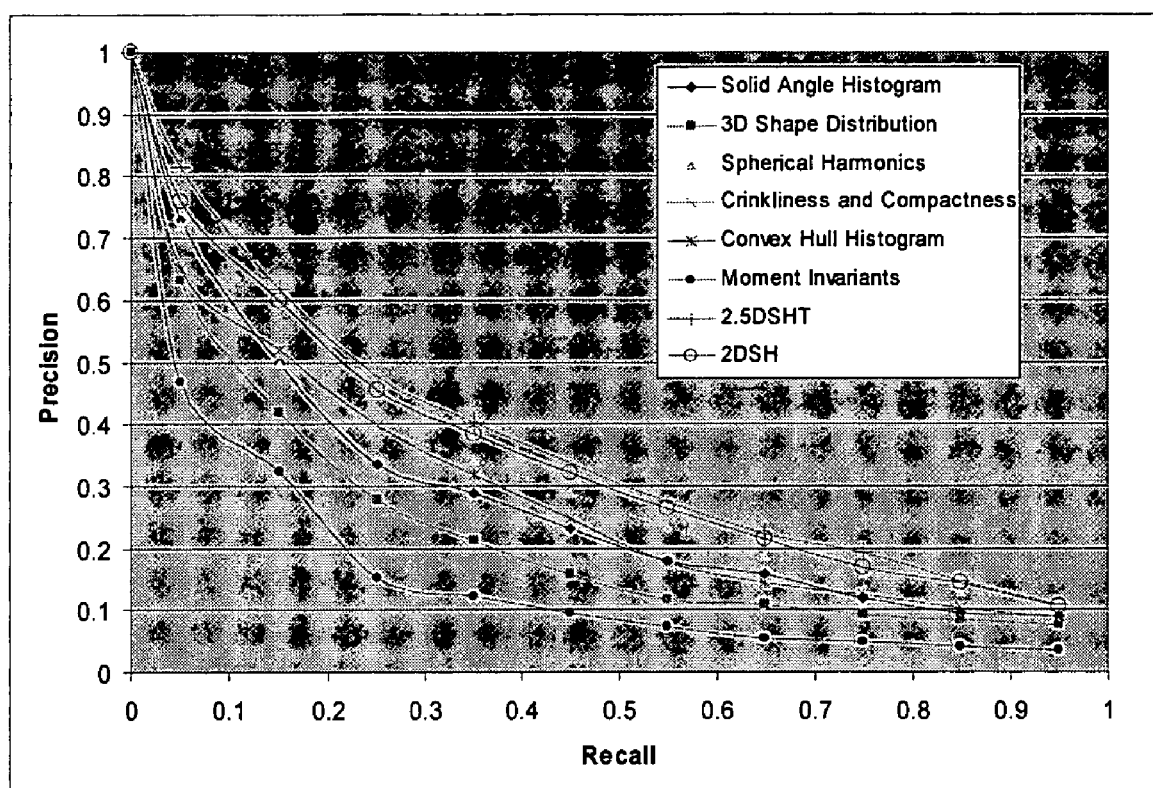
FIG. 35 depicts the recall-precision curves for an example 3D model.

For 3D model retrieval, to compare the performance between our proposed methods and other methods, six other available 3D shape descriptors are implemented: (1) Moment Invariants (MI) [53]; (2) Spherical Harmonics (SH) [5]; (3) Crinkliness and Compactness (CC) [54]; (4) 3D Shape Distribution (3DS) [12]; (5) Convex Hull Histogram (CHH) [55]; and (6) Solid Angle Histogram (SAH) [56]. The final PR curves are shown in FIG. 35.

Figure 36:
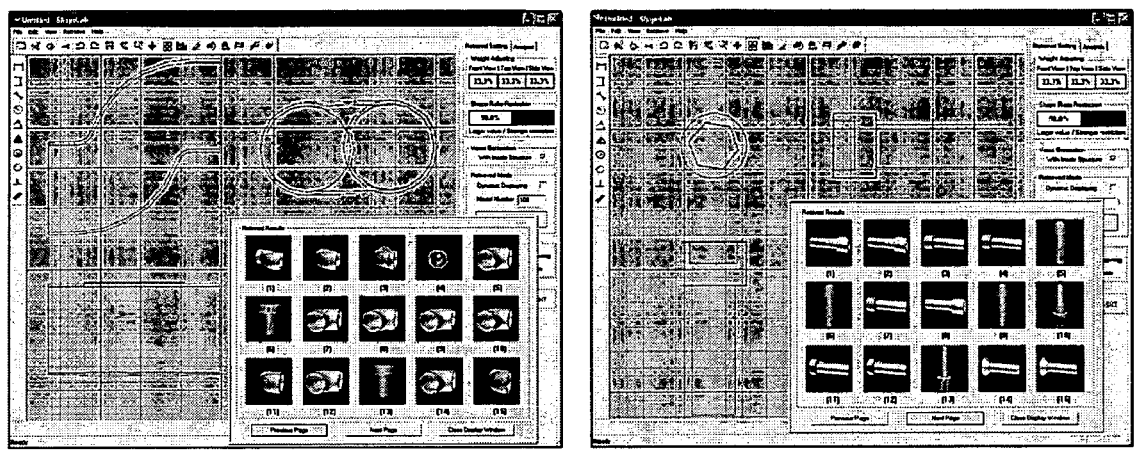
FIG. 36 shows an embodiment of a user interface with sketches and retrieved results.

From the precise-recall curves, it has been found that the 2.5DSHT has the best discrimination ability while the 2DSH is the second best method. Similar to the 2D drawing retrieval, the 2.5D spherical harmonics transformation method has been found to be good at differentiating models with readily apparent structure shape, such as table- or chair-like models, while the 2D shape histogram method is good at differentiating models with similar contour but different inside structure. FIG. 36 shows some retrieval examples.

The two proposed methods are both rotation invariant descriptors and provide a compact representation of a 2D drawing. With the two methods, the shape matching problem is reduced to several simple steps, such as sampling, normalization, and distance computation between descriptors, and there is no need to determine a common pose and find feature correspondences between different drawings. Generally, the 2.5D spherical harmonics method needs fewer dimensionalities (i.e., fewer signatures) than the 2D shape histogram method does. For example, in our retrieval system, the bandwidth is 64 in the 2.5D spherical harmonics method, i.e., the descriptor of a drawing contains 64 signatures. In contrast, the 2D shape histogram contains more than 200 signatures. However, the 2D shape histogram method allows users to emphasize certain local shapes by specifying a high sampling rate upon these shapes, while it is difficult for the 2.5D spherical harmonics method to do this. Other advantages of the proposed two methods are their simplicity and fast speed. In experiments, the general retrieval time is less than 0.1 seconds and the indexing process for 1,000 drawings is less than ten minutes since the I/O accessing is time-consuming. The computing is done on a PC with 2.4 GHz CPU and 512 MB RAM.

Thus, as disclosed above a user can enter two-dimensional input, such as a sketch or drawing, and can search a library of two-dimensional drawings and/or three-dimensional models in order to retrieve the drawing(s) or model(s) that most closely approximate the input. Such input and the library information are compared in two-dimensional space, based on descriptors for two-dimensional drawing or projections. The user can weight or emphasize one projection or feature in searching or refining a search. The user can alter or edit a drawing or model found in searching so as to refine a search, and can choose features of search results so as to narrow the results further.

Referring back generally to FIG. 2(B), one embodiment of such a system is schematically indicated. At box 100, model or drawing information is entered by the user. Box 110 refers to the calculation or computation of an appropriate bounding box for the inputted information, which may include a determination of an appropriate pose as discussed above. At box 120, views of the inputted model or drawing are generated using the bounding box and/or pose, which views may be full views, contour views and/or silhouette views. Box 130 refers to similarity measurement, which may include determination of appropriate descriptors for the inputted information as discussed above and comparison of such descriptors to descriptors for models and/or drawings included in the accessed library. Once such a measurement or comparison is made, appropriate models or drawings are outputted from the library to the user's screen, to disk, to hard copy, or otherwise as the user may desire. The steps may be implemented by hardware and/or software appropriately configured to perform them.

Referring generally to FIG. 3, another embodiment of a system using the methods disclosed herein is schematically shown. Initially, a library 200 having information of three-dimensional models and a library 210 having information of two-dimensional drawings may be provided. These libraries may be provided in one or more memory units or data storage apparatuses. Models from library 200 are analyzed and two-dimensional drawings are generated from them, as depicted at block 220. Generation of the drawings of a particular model may include determination of an appropriate pose of the model, e.g. in an attitude commonly viewed by or drawn by engineers, as depicted at block 222, and generating views of the posed model, e.g. along three orthogonal axes determined by the pose, as depicted at block 224. When drawings are generated of all desired models, the drawings can be collected in a library 230. In a particular embodiment, library 230 can be a part of or associated with library 210 of other two-dimensional drawings, as suggested in FIG. 3.

From the user-input side, an input box is depicted a block 240. Input can include sketches (block 242), two-dimensional drawings (block 244) and/or three-dimensional models (block 246). Sketches or other drawings can be given particular parameters, as indicated in block 250 prior to, at or after input into the system. The inputted information can be edited by the user, if desired. Three-dimensional model input can be posed (if necessary) and two-dimensional views are generated. Block 260 depicts a method of creating descriptors for two-dimensional drawings, such as those methods discussed above. Descriptors can be created for drawings and models from libraries 200 and 210, as well as for two-dimensional drawing(s) inputted by the user. The descriptor(s) of inputted drawing(s) are compared to those of library drawings or views of library models, as depicted in block 270, and the most similar are shown or outputted to the user, as depicted at block 280. The degree of similarity required for output can be determined in advance by the user, as for example by a request to output the forty most similar models or drawings, or can be set in or by the system. The retrieved results can be displayed as the drawings of library 210 or of the pseudo-two-dimensional drawing library 230, as depicted at block 282, or can be displayed as three-dimensional models as depicted at block 284. If the user desires, the set of output results can be further queried for particular features, or by searching further with a weighted or emphasized view as discussed above, or otherwise further analyzed.

What is claimed is:

1. A method comprising: conducting a search of a database comprising 2D or 3D representations of objects using at least one graphical input parameter, wherein said graphical input parameter is a 2D or a 3D representation of all or part of an object;
receiving a set of results from said search;
inputting a new graphical input parameter;
searching said set of results with respect to said new parameter; and
obtaining a subset of said results;
wherein said conducting a search comprises providing at least one two-dimensional drawing of an object to a computer system; creating one or more descriptors for said at least one drawing, said descriptor being adapted for use in a search of two-dimensional drawings; and further wherein said creating step includes expanding the at least one drawing to three dimensions to create a new 2.5D shape and representing the 2.5D shape as a spherical function and employing a spherical harmonic transformation, thereby obtaining a rotation invariant descriptor; and
wherein said drawing is oriented with respect to two axes in a plane, and wherein said expanding a drawing to three dimensions includes:
computing a bounding box aligned with said axes, said bounding box having a center and two diagonals, said diagonals having lengths that are either equal or unequal;
determining a sphere having as its center the center of said bounding box, said sphere further having a radius of half the longer of said diagonal lengths of said bounding box and having an equator plane that is coplanar with the plane of said drawing;
generating a set of rays in said equator plane that originate from said center of said sphere
and calculating the points of intersection between said rays and said drawing, said points being identified by coordinates, said rays having a unique angle;
calculating a spherical angle unique to each intersection point distributed along a ray, said spherical angle being the arctan of the distance to the intersection point from said center divided by said radius; and
lifting each intersection point out of said plane of said drawing by the spherical angle unique to said intersection point.

2. A method according to claim 1, wherein said bounding box has a first edge parallel to one of said axes and a second edge parallel to a second of said axes, the method further comprising: normalizing one of said edges by a predetermined value.

3. A method according to claim 2, wherein said transformation is a fast spherical transformation, wherein a spherical function of bandwidth B is sampled on Chebyshev points.

4. A method, comprising: conducting a search of a database comprising 2D or 3D representations of objects using at least one graphical input parameter, wherein said graphical input parameter is a 2D or a 3D representation of all or part of an object;
receiving a set of results from said search;
inputting a new graphical input parameter;
searching said set of results with respect to said new parameter; and
obtaining a subset of said results;
wherein said conducting a search comprises providing at least one two-dimensional drawing of an object to a computer system; creating one or more descriptors for said at least one drawing, said descriptor being adapted for use in a search of two-dimensional drawings; and further wherein said creating step includes expanding the at least one drawing to three dimensions to create a new 2.5D shape and representing the 2.5D shape as a spherical function and employing a spherical harmonic transformation, thereby obtaining a rotation invariant descriptor; and
wherein said creating step includes building a distance histogram for said drawing; and
wherein said building step includes transforming said drawing into a set of line segments; sampling points from said segments to derive a shape distribution; and
wherein said sampling step includes summing the length of said segments to obtain a total length value generating a first random number between zero and said total length value; finding the segment along whose length said first random number falls, said segment having a first endpoint with a first and second coordinate and a second endpoint with a first and second coordinate; generating a second random number between zero and one, said second random number being a real number; creating a sample point having first and second coordinates, said first coordinate of said sample point determined by multiplying the difference between the second coordinates of said endpoints by said second random number and adding the first coordinate of said first endpoint, and said second coordinate of said sample point determined by multiplying the difference between the second coordinates of said endpoints by said second random number and adding the second coordinate of said first endpoint.

5. A method, comprising: conducting a search of a database comprising 2D or 3D representations of objects using at least one graphical input parameter, wherein said graphical input parameter is a 2D or a 3D representation of all or part of an object;
receiving a set of results from said search;
inputting a new graphical input parameter;
searching said set of results with respect to said new parameter; and
obtaining a subset of said results;
wherein said conducting a search comprises providing at least one two-dimensional drawing of an object to a computer system; creating one or more descriptors for said at least one drawing, said descriptor being adapted for use in a search of two-dimensional drawings; and further wherein said creating step includes expanding the at least one drawing to three dimensions to create a new 2.5D shape and representing the 2.5D shape as a spherical function and employing a spherical harmonic transformation, thereby obtaining a rotation invariant descriptor;

wherein said drawing is oriented with respect to two axes in a plane, and wherein said expanding a drawing to three dimensions includes:

computing a bounding box aligned with said axes, said bounding box having a center and two diagonals, said diagonals having lengths that are either equal or unequal;

determining a sphere having as its center the center of said bounding box, said sphere further having a radius of half the longer of said diagonal lengths of said bounding box and having an equator plane that is coplanar with the plane of said drawing;

generating a set of rays in said equator plane that originate from said center of said sphere and calculating the points of intersection between said rays and said drawing, said points being identified by coordinates, said rays having a unique angle;

calculating a spherical angle unique to each intersection point distributed along a ray, said spherical angle being the arctan of the distance to the intersection point from said center divided by said radius; and lifting each intersection point out of said plane of said drawing by the spherical angle unique to said intersection point;

wherein said bounding box has a first edge parallel to one of said axes and a second edge parallel to a second of said axes, the method further comprising; normalizing one of said edges by a predetermined value;

wherein said transformation is a fast spherical transformation, wherein a spherical function of bandwidth B is sampled on Chebyshev points; and further comprising:

defining a division number for the distance histogram, said division number identifying the number of parts of the distance histogram;

determining a standard value for normalization; and calculating the distances between sample point pairs and counting the number of pairs in each part of the distance histogram.

* * * * *